(12) United States Patent
Wang

(10) Patent No.: US 7,750,356 B2
(45) Date of Patent: Jul. 6, 2010

(54) SILICON OPTICAL PACKAGE WITH 45 DEGREE TURNING MIRROR

(75) Inventor: Tak Kui Wang, Saratoga, CA (US)

(73) Assignee: Avago Technologies Fiber IP (Singapore) Pte. Ltd., Singapore (SG)

(*) Notice: Subject to any disclaimer, the term of this patent is extended or adjusted under 35 U.S.C. 154(b) by 1463 days.

(21) Appl. No.: 11/124,457

(22) Filed: May 4, 2005

(65) Prior Publication Data
US 2006/0252167 A1 Nov. 9, 2006

(51) Int. Cl.
*H01L 21/00* (2006.01)
(52) U.S. Cl. .............. 257/98; 257/E33.67; 257/E33.71; 257/E33.72; 438/27
(58) Field of Classification Search ............... 257/98; 438/27
See application file for complete search history.

(56) References Cited

U.S. PATENT DOCUMENTS

| | | | | |
|---|---|---|---|---|
| 5,912,872 A | * | 6/1999 | Feldman et al. | 369/13.32 |
| 6,940,885 B1 | * | 9/2005 | Cheng et al. | 372/50.1 |
| 7,122,391 B2 | * | 10/2006 | Kuzma | 438/29 |
| 2002/0163865 A1 | | 11/2002 | Zimmer | |
| 2004/0101020 A1 | | 5/2004 | Bhandarkar | |
| 2005/0001282 A1 | | 1/2005 | Steinberg | |
| 2005/0062122 A1 | * | 3/2005 | Gallup et al. | 257/432 |
| 2005/0285131 A1 | * | 12/2005 | Gallup et al. | 257/99 |
| 2006/0239319 A1 | * | 10/2006 | Kozlovsky et al. | 372/36 |

FOREIGN PATENT DOCUMENTS

| | | |
|---|---|---|
| CN | 1595741 | 3/2005 |
| DE | 3914835 | 5/1989 |
| DE | 19510559 | 3/1995 |
| DE | 10305171 | 8/2004 |
| DE | 102005031132 | 7/2005 |
| EP | 1515364 | 3/2005 |

OTHER PUBLICATIONS

Hans L. Althaus et al., Microsystems and Wafer Processes for Volume Production of Highly Reliable Fiber Optic Components for Telecom- and Datacom-Application, IEEE Transactions on Components, Packaging, and Mfg. Tech.-Part B, vol. 21, No. 2, May 1998, pp. 147-156.

* cited by examiner

Primary Examiner—A. Sefer

(57) ABSTRACT

An optical package includes a sub-mount, an edge-emitting laser mounted on the sub-mount, a collimating ball lens mounted on the sub-mount adjacent to the edge-emitting laser, a mirror mounted on the sub-mount adjacent to the collimating ball lens. The sub-mount is made of a bottom wafer. A lid is bonded to the sub-mount to form the laser package. The lid is made of a middle wafer bonded to a top wafer. The middle wafer defines an opening that accommodates the edge-emitting laser, the collimating ball lens, and the mirror. The opening is defined by vertical sidewalls. The top wafer further includes a lens above the mirror.

7 Claims, 26 Drawing Sheets

SILICON OPTICAL PACKAGE WITH 45 DEGREE TURNING MIRROR

DESCRIPTION OF RELATED ART

For the long reach market in telecommunications, lasers that emit long wavelength are used. These lasers typically emit light parallel to the wafer (i.e., they are edge-emitting lasers). When an edge-emitting laser is put into an optical package, it is desired for the light to exit perpendicular to the package. Typically a 45 degree turning mirror is used to turn the light perpendicular to the package. Due to the large divergent angles of the edge-emitting laser (30 to 70 degrees depending on the axis), the turning mirror is located close to the edge-emitting laser in order to minimize the sizes of the mirror and any subsequent lenses.

SUMMARY

In one embodiment of the invention, an optical package includes a sub-mount, an edge-emitting laser mounted on the sub-mount, a collimating ball lens mounted on the sub-mount adjacent to the edge-emitting laser, a mirror mounted on the sub-mount adjacent to the collimating ball lens. The sub-mount is made of a bottom wafer. A lid is bonded to the sub-mount to form the laser package. The lid is made of a middle wafer bonded to a top wafer. The middle wafer defines an opening that accommodates the edge-emitting laser, the collimating ball lens, and the mirror. The opening is defined by vertical sidewalls. The top wafer further includes a lens above the mirror.

BRIEF DESCRIPTION OF THE DRAWINGS

Use of the same reference numbers in different figures indicates similar or identical elements.

DETAILED DESCRIPTION

FIGS. 1 to 10 illustrate a method to make a hermetic optical package 800 (FIG. 10) in one embodiment of the invention.

Figure 1:
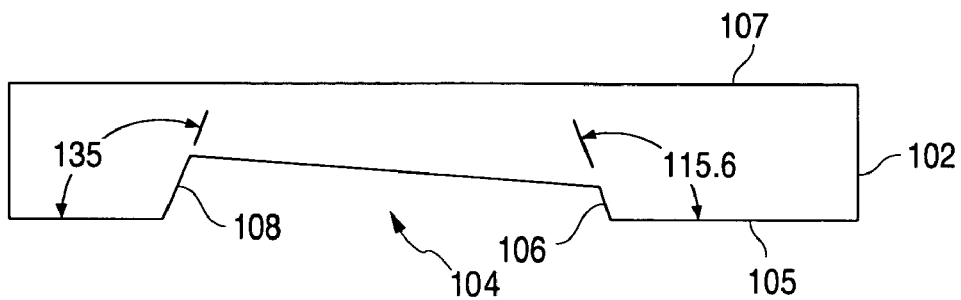
FIGS. 1 to 10 illustrate a method to make a hermetic optical package in one embodiment of the invention.

In FIG. 1, an upper sub-mount wafer 102 is provided. Wafer 102 is an off-axis cut silicon wafer that has a <100> plane oriented at a 9.7 degree offset from a top surface 107 of wafer 102. Wafer 102 has a thickness of approximately 500 microns (μm). A bottom surface 105 of wafer 102 is anisotropically etched to form a cavity 104.

In one embodiment, the anisotropic etch of bottom surface 105 uses a nitride-oxide mask consisting of an oxide layer on bottom surface 105 and a nitride layer on the oxide layer. The oxide layer is thermally grown in steam and the nitride layer is deposited by lower pressure chemical vapor deposition (LPCVD). Using photoresist, the nitride layer is dry etched (e.g., plasma etched) to expose an area of the oxide layer to be patterned. Using the nitride layer as an etch mask, the oxide layer is wet etched with a hydrofluoric acid (HF) solution to expose an area on bottom surface 105 to be anisotropically etched. Bottom surface 105 is anisotropically etched using a solution such as potassium hydroxide (KOH) to form cavity 104.

As wafer 102 has a <100> plane oriented at a 9.7 degree offset from top surface 107, cavity 104 has angled sidewalls 106 and 108 formed along <111> planes of the silicon substrate. Angled sidewall 106 is oriented at a 115.6 degree offset from bottom surface 105 and angled sidewall 108 is oriented at a 135 degree offset from bottom surface 105.

Figure 2:
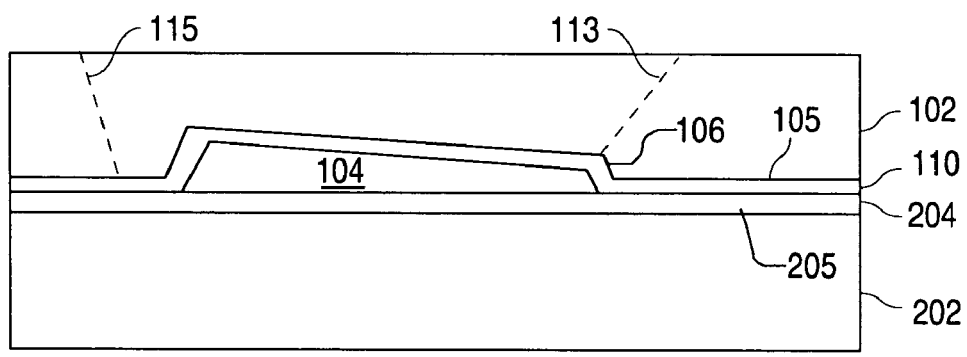

In FIG. 2, an oxide layer 110 is formed over bottom surface 105 and cavity 104 of wafer 102. In one embodiment, oxide layer 110 is silicon dioxide grown thermally in steam and has a thickness of up to approximately 2,500 angstroms (Å).

Next, a lower sub-mount wafer 202 is provided. In one embodiment, wafer 202 is standard <100> cut silicon wafer and has a thickness of 500 μm. An oxide layer 204 is formed over a top surface 205 of wafer 202. In one embodiment, oxide layer 204 is silicon dioxide grown thermally in steam and has a thickness of up to approximately 2,500 Å. Wafers 102 and 202 are then joined by fusion bonding.

Figure 3:
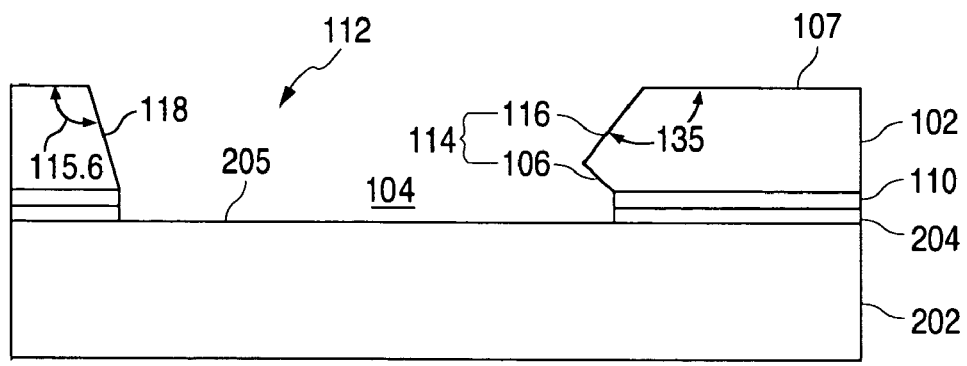

In FIG. 3, top surface 107 of wafer 102 is anisotropically etched down to cavity 104 to form a cavity 112. In one embodiment, top surface 107 is anisotropically etched using a nitride-oxide mask with a solution such as KOH to form cavity 112. Referring back to FIG. 2, phantom lines 113 and 115 illustrate the intended etch through wafer 102.

Referring back to FIG. 3, cavity 112 is defined by at least a wedge-shaped sidewall 114 and an angled sidewall 118. Wedge-shaped sidewall 114 consists of an angled upper portion 116 from the current etch, and an angled lower portion 106 from the prior etch in FIG. 1. As wafer 102 has a <100> plane oriented at a 9.7 degree offset from top surface 107 of wafer 102, upper portion 116 and angled sidewall 118 are formed along <111> planes of the silicon substrate. Upper portion 116 is oriented at a 135 degree offset from top surface 107 and angled sidewall 118 is oriented at a 115.6 degree offset from top surface 107.

Upper portion 116 preferably has a smooth surface because it will be used to form a 45 degree turning mirror. However, upper portion 116 can be roughened during the removal of the nitride layer in the nitride-oxide mask used to form cavity 112. Thus, an oxide layer can be thermally grown over upper portion 116 after etching cavity 112. The nitride layer in the nitride-oxide mask is removed with a dry etch (e.g., a plasma etch) while the oxide layer protects wafer 102, including upper portion 116. The oxide layer is then removed by a wet etch (e.g., an HF wet etch).

Figure 4A:
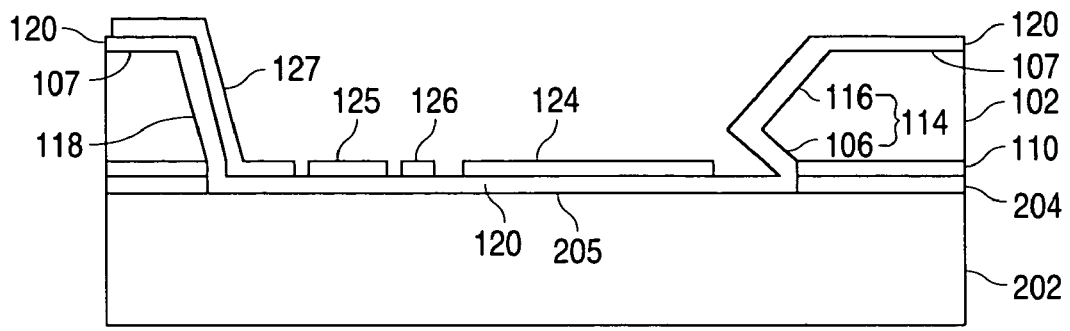

In FIG. 4A, an oxide layer 120 is formed over sidewalls 114 and 118, and over the exposed portion of top surface 205. Oxide layer 120 is used to insulate individual components that are later formed. In one embodiment, oxide layer 120 is silicon dioxide grown thermally in steam and has a thickness of at least 2,500 Å.

Contact pad 124, contact pad 125, trace 126, and trace 127 are formed on oxide layer 120. In one embodiment, the contact pads and the traces are formed as follows. A chromium-gold-chromium (CrAuCr) metallization is evaporated over oxide layer 120. A photoresist is electroplated or sprayed over the top Cr layer in the CrAuCr metallization. The photoresist is then exposed and developed. Using the patterned photoresist, the CrAuCr metallization is wet etched to form contact pad 124, contact pad 125, trace 126, and trace 127. For clarity, the CrAuCr metallization is illustrated as a single layer.

Traces 126 and 127 are three-dimensional structures that start from top surface 205, continue up the sidewalls of cavity 112 (e.g., sidewall 118), and end on top surface 107 of wafer 102. Traces 126 and 127 provide external electrical connections (e.g., control and data signals). Although not shown, mounting pads 124 and 125 are connected to similar traces to provide external electrical connections (e.g., ground). In one embodiment, traces 126 and 127 are radio frequency (RF) conductors.

Figure 4B:
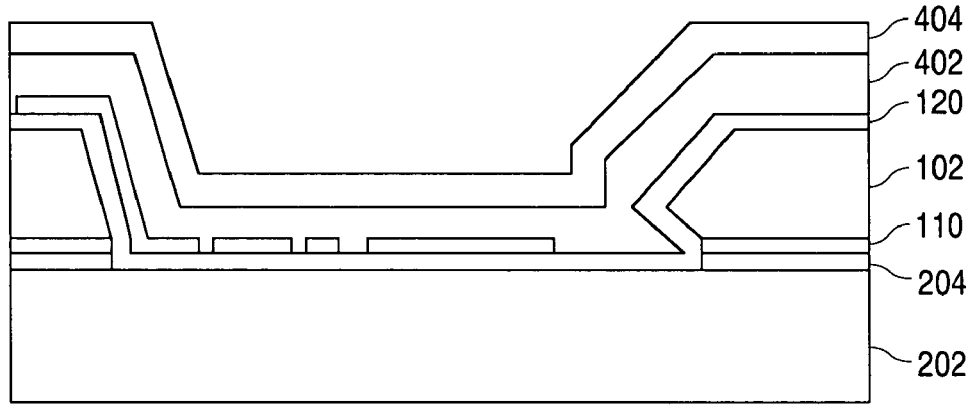

In FIG. 4B, a nitride layer 402 is formed over the structure. In one embodiment, nitride layer 402 is formed by plasma enhanced chemical vapor deposition (PECVD). A chromium-nickel-gold (CrNiAu) metallization 404 is formed over nitride layer 402. In one embodiment, CrNiAu metallization 404 is formed by evaporation. For clarity, CrNiAu metallization 404 is illustrated as a single layer.

Figure 4C:
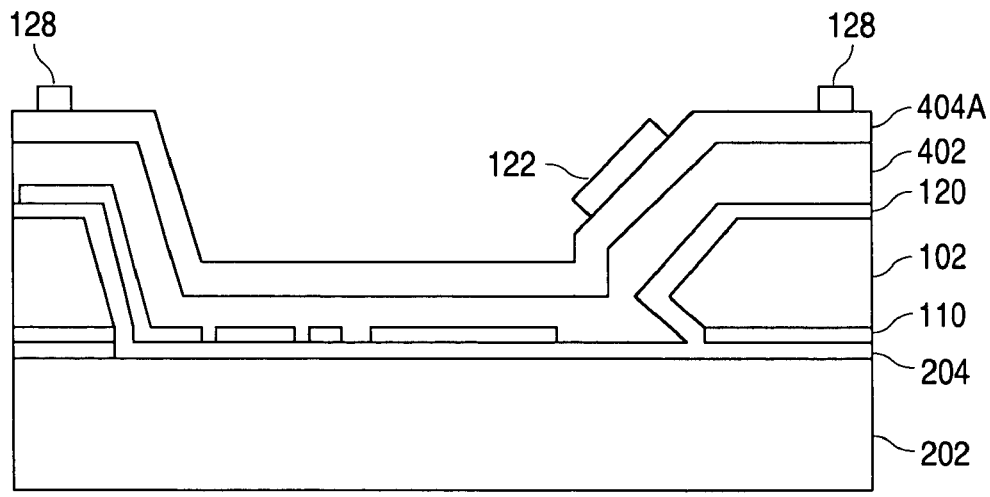

In FIG. 4C, a mirror 122 and a bonding ring 128 are formed from CrNiAu metallization 404. In one embodiment, the mirror and the bonding ring are formed as follows. A photoresist is electroplated or sprayed over the Au layer in the CrNiAu metallization, patterned, and developed. Areas of the Au layer not protected by the photoresist are wet etched away. The photoresist is stripped and then the areas of the Ni and Cr layers in the CrNiAu metallization not protected by the Au layer are wet etched away. The remaining Au on Ni form a mirror 122 and a bonding ring 128. Note that a layer 404A illustrates the Cr layer in CrNiAu metallization 404 (FIG. 4C).

Figure 5:
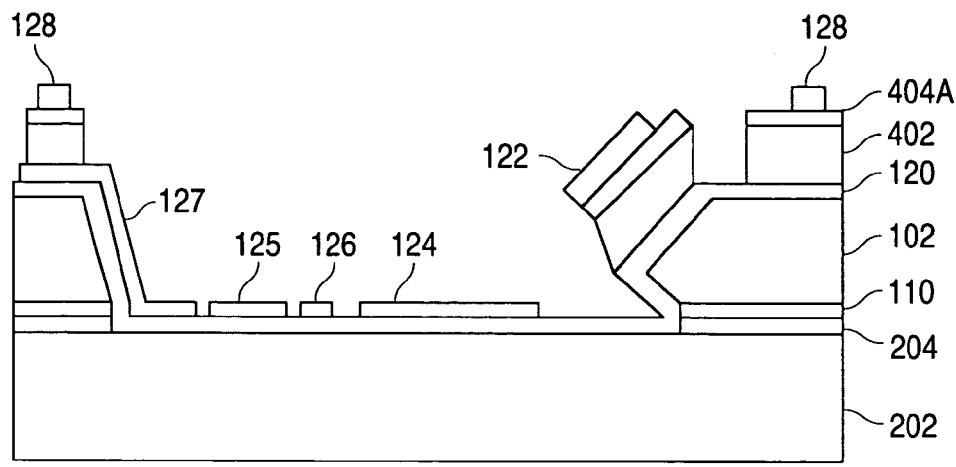

In FIG. 5, Cr layer 404A and nitride layer 402 over pad 124, pad 125, trace 126, and trace 127 are removed. In one embodiment, the Cr layer and the nitride layer are removed as follows. A photoresist is electroplated or sprayed over Cr layer 404 (FIG. 4C), patterned, and developed to protect mirror 122 and bonding ring 128. Areas of Cr layer 404 not protected by the photoresist are wet etched away while areas of nitride layer 402 not protected by the photoresist are dry etched away (e.g., plasma etched). The photoresist is then stripped.

Figure 6:
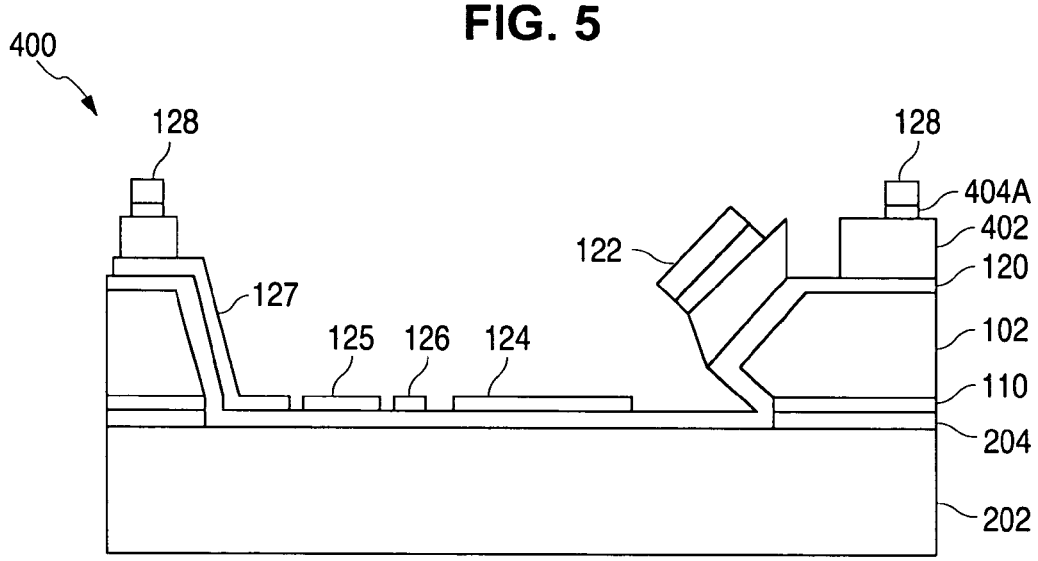

In FIG. 6, the top Cr layers in the CrAuCr pad 124, pad 125, trace 126, and trace 127 are removed. In one embodiment, the top Cr layer is removed by wet etching. Thus, pad 124, pad 125, trace 126, and trace 127 now consist of Au on the bottom Cr layer. Note that portions of Cr layer 404A not protected by mirror 122 and bonding ring 128 are also etched away. The resulting structure is a sub-mount 400.

Figure 7:
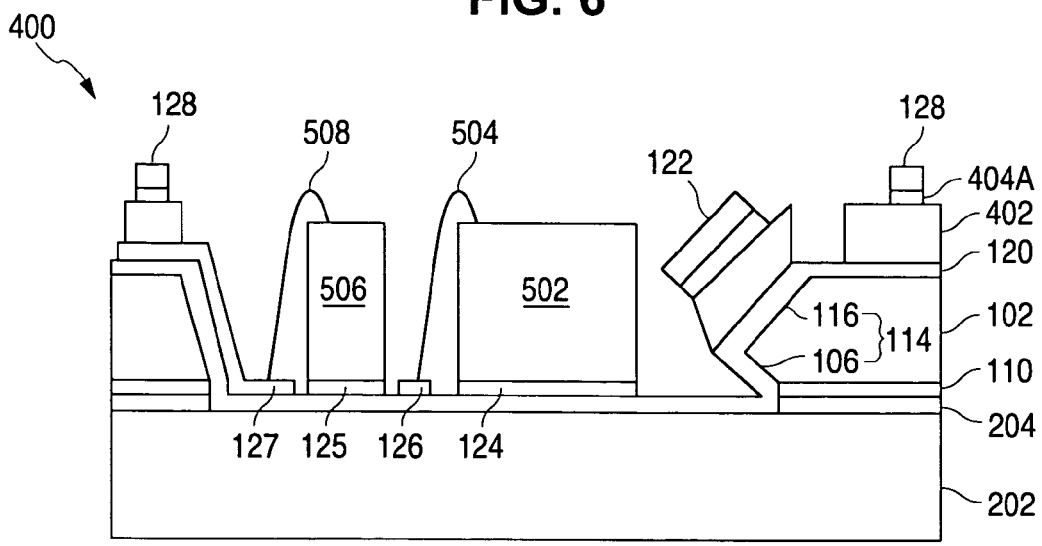

In FIG. 7, an edge-emitting laser die 502 is mounted by a gold-tin (AuSn) solder on pad 124 adjacent to mirror 122. The emission point of laser die 502 is located opposite mirror 122 so the mirror receives substantially all the emitted light Laser die 502 is connected by a bond wire 504 to trace 126 that will lead outside of the finished package. A monitor photodiode die 506 is mounted by AuSn solder on pad 125. Photodiode die 506 is connected by bond wire 508 to trace 127 that will lead outside of the finished package.

Note that lower portion 106 of sidewall 114 allows laser die 502 to be placed very close to mirror 122. Without lower surface 106, upper portion 116 of sidewall 114 would extend diagonally outward and limit how close laser die 502 can be placed next to mirror 122. By placing laser die 502 close to mirror 122, the sizes of mirror 122 and any subsequent lenses are reduced to make a more compact optical package.

Figure 8:
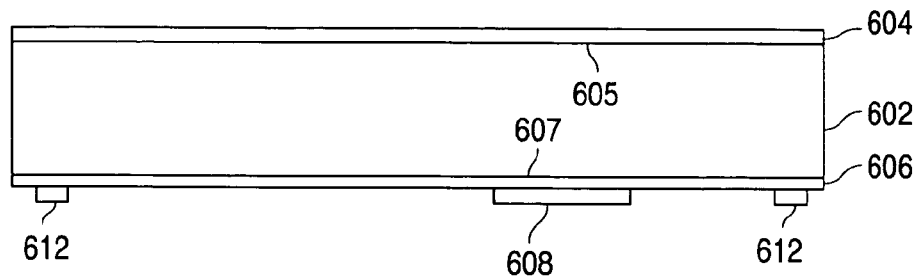

In FIG. 8, a lid wafer 602 is provided. In one embodiment, wafer 602 is silicon and has a thickness of 500 µm. A top AR coating 604 is formed on a top surface 605 of wafer 602 while a bottom AR coating 606 is formed on a bottom surface 607 of wafer 602.

A lens 608 is formed on AR coating 606. Depending on the embodiment, lens 608 can be a converging lens or a collimating lens. In one embodiment, lens 608 is a diffractive optical element (DOE) patterned from a stack of phase shifting layers deposited on AR coating 606. Adjacent phase shifting layers are separated by an etch stop layer used to successively etch the stack to form the desired diffractive lens.

A bonding ring 612 is formed on AR coating 606 to match bonding ring 128 on sub-mount 400 (FIG. 6). In one embodiment, bonding ring 612 is a TiPtAu metallization evaporated onto AR coating 606. AuSn solder can be formed on top of the bonding ring 128. The AuSn solder can be a solder preform or formed by evaporation.

Figure 9:
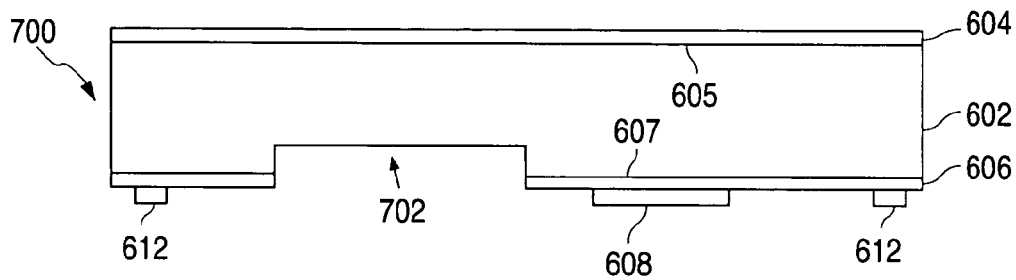

In FIG. 9, a clearance indentation 702 is formed on bottom surface 607 of wafer 602. In one embodiment, indentation 702 is formed using deep reactive ion etching (DRIE) to a depth of approximately 100 µm. The resulting structure is a lid 700.

Figure 10:
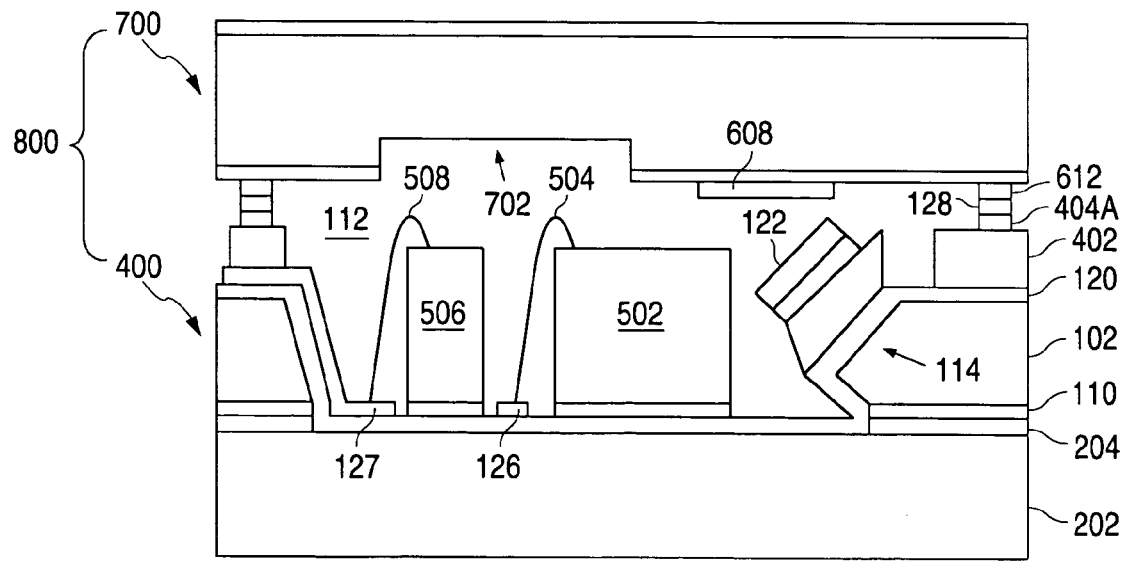

In FIG. 10, lid 700 is solder bonded to sub-mount 400 to form optical package 800. Moderate temperature is applied to form a solder bond between bonding rings 612 and 128. Note that lens 608 is located above mirror 122 and indentation 702 provides room for bond wires 504 and 508.

In operation, light diverges from the emission point of laser die 502 and impinges mirror 122. The diverging light is reflected by mirror 122 onto lens 608. Lens 608 converges the light into an optical fiber (not shown).

Figure 11:
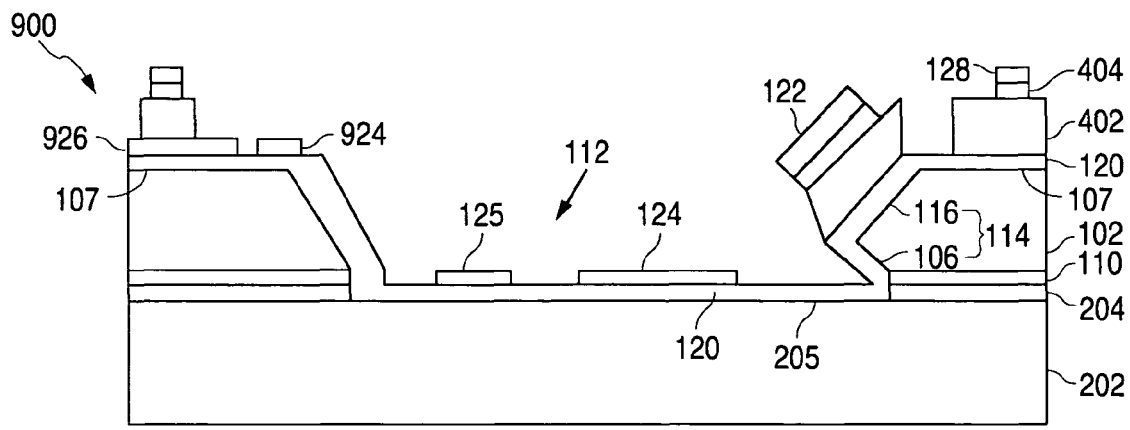
FIGS. 11 to 13 illustrate a method to make a hermetic optical package in another embodiment of the invention.
Figure 12:
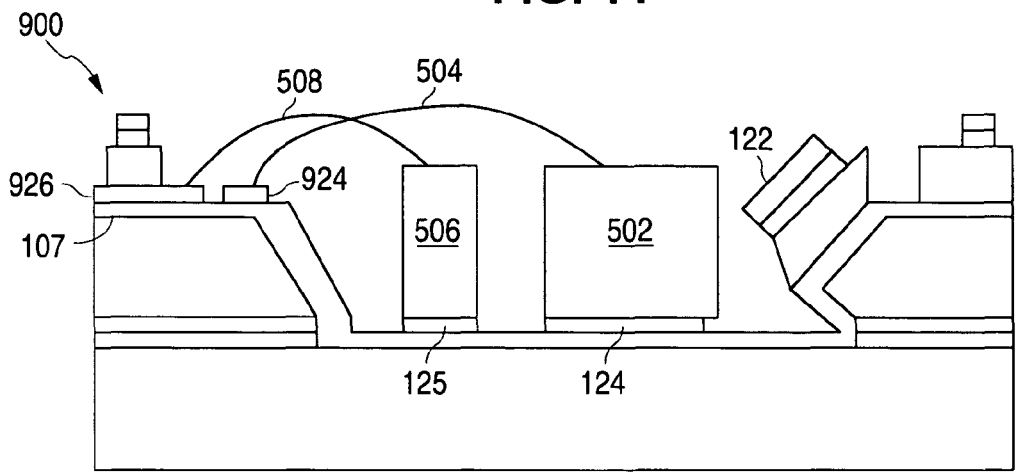
Figure 13:
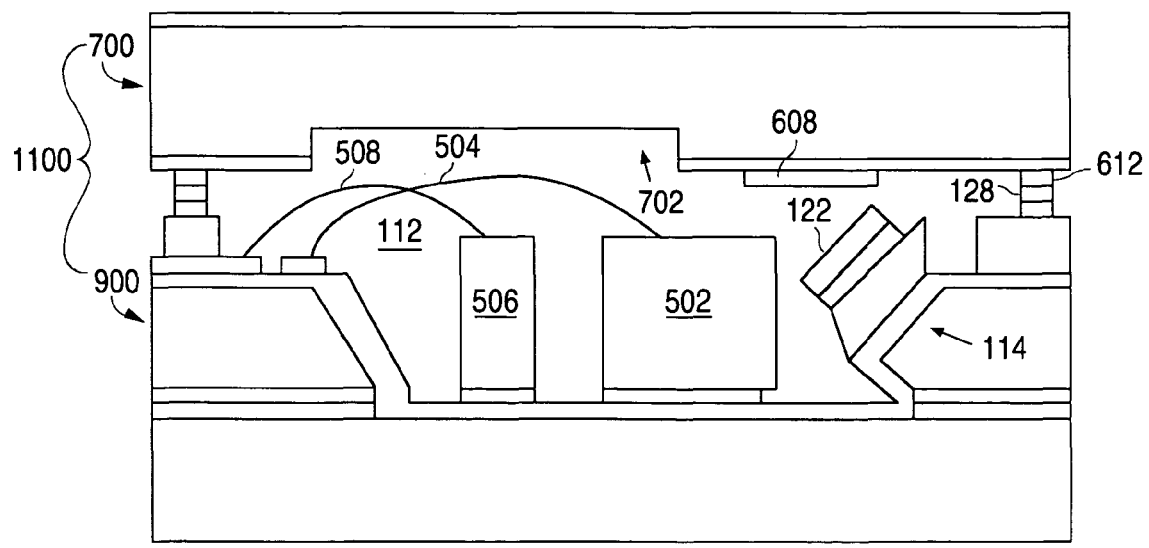
Figure 14:
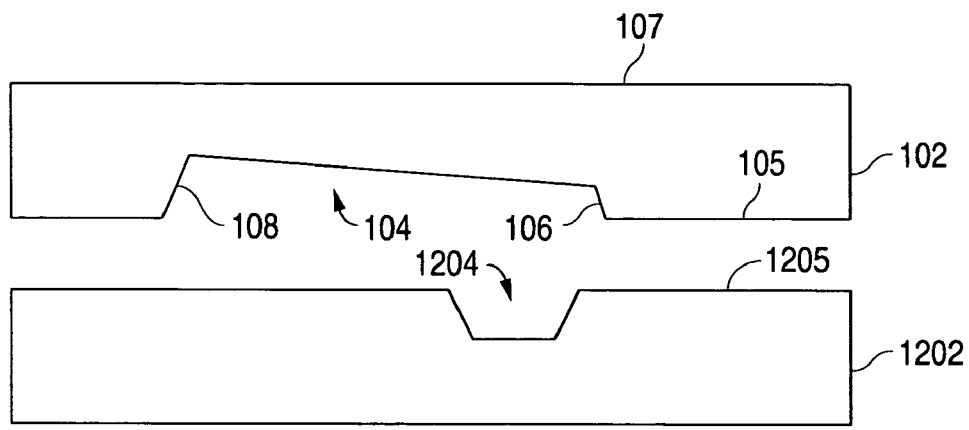
FIGS. 14 to 19 illustrate a method to make a non-hermetic optical package in another embodiment of the invention.

FIGS. 11 to 13 illustrate a method to make a hermetic optical package 1100 (FIG. 13) in one embodiment of the invention. Package 1100 is similar to package 800 (FIG. 10) except that traces with critical dimensions are now located on top surface 107 of wafer 102. This improves signal speed by shortening conductor lengths. This also improves feature definition because critical traces are not formed at multiple depths, which would otherwise require out-of-focus patterning techniques. This is especially important for RF traces having features defined within 2 to 5 µm.

In FIG. 11, a sub-mount 900 is formed. Sub-mount 900 is similar to sub-mount 400 (FIG. 6) except traces 924 and 926 have replaced traces 126 and 127. Traces 924 and 926 are formed on top surface 107 with methods described above for traces 126 and 127. Note that the dimensions for traces 924 and 926 are more tightly controlled than the dimensions for pads 124 and 125. This is because traces 924 and 926 carries control and data signals to dies 502 and 506, whereas pads 124 and 125 provide grounding to dies 502 and 506.

In FIG. 12, laser die 502 and photodiode die 506 are mounted by AuSn solder on pads 124 and 125. Laser die 502 is then connected by bond wire 504 to trace 924, and photodiode die 506 is connected by bond wire 508 to trace 926. Although not illustrated, pads 124 and 125 are also connected by bond wires to traces on top surface 107.

In FIG. 13, lid 700 is solder bonded to sub-mount 900 to form optical package 1100 using AnSn solder.

Figure 16:
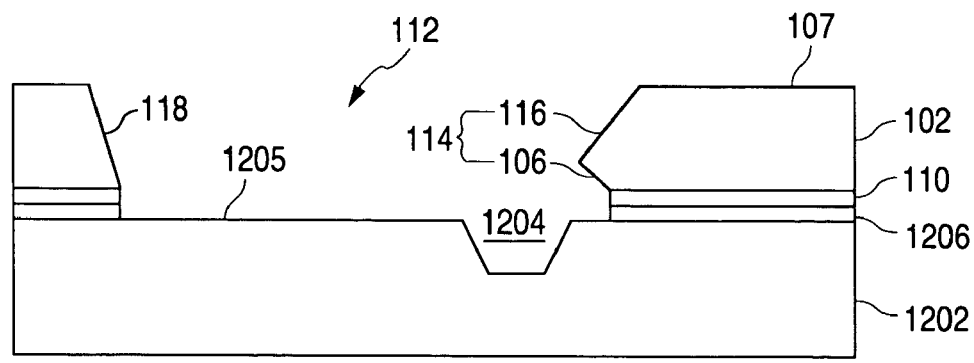
Figure 17:
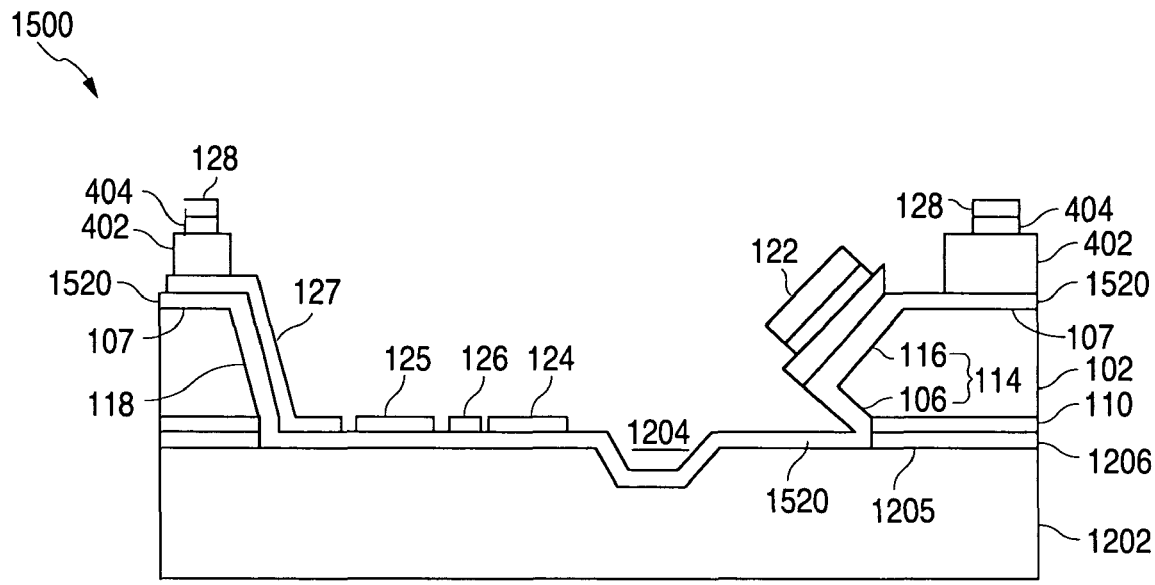
Figure 18:
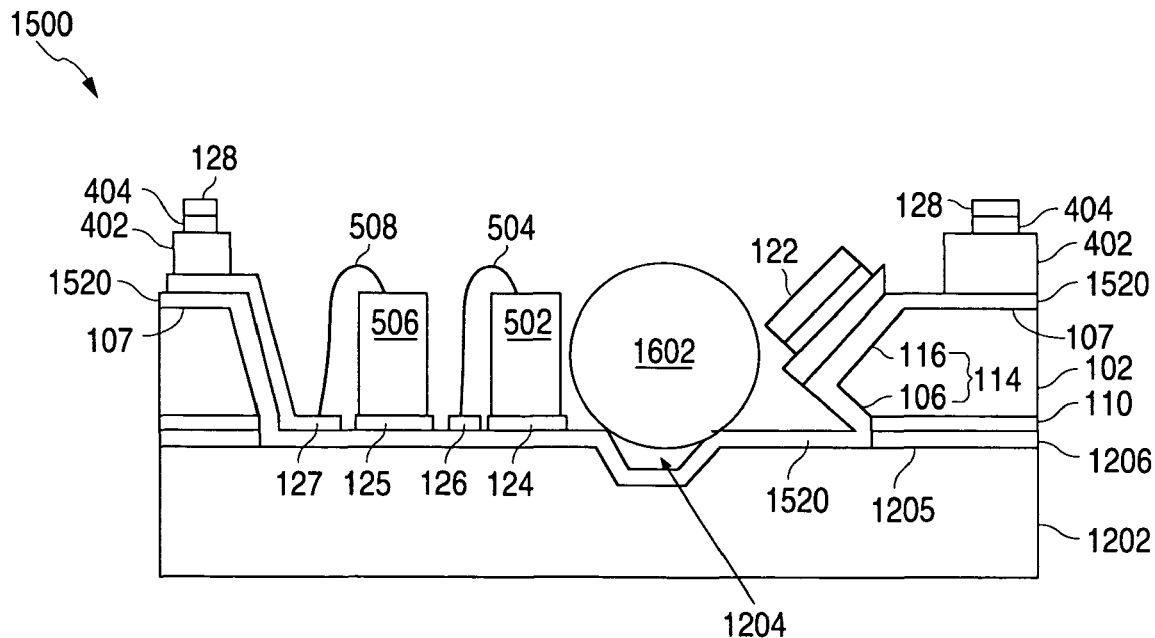

FIGS. 14 to 19 illustrate a method to make a hermetic optical package 1900 (FIG. 19) in one embodiment of the invention. Optical package 1900 is similar to optical package 800 (FIG. 10) but includes a collimating ball lens 1602 (FIG. 18). Using ball lens 1602, the tolerance between mirror 122 and lens 608 can be relaxed.

Figure 15:
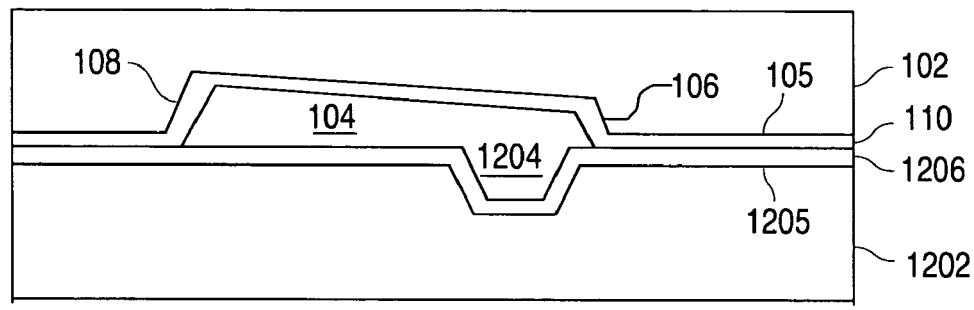

In FIG. 15, upper sub-mount wafer 102 is provided. Cavity 104 is optionally formed in bottom surface 105 of wafer 102. Cavity 104 is defined by at least angled sidewalls 106 and 108.

Next, a lower sub-mount wafer 1202 is provided. In one embodiment, wafer 1202 is standard <100> cut silicon wafer and has a thickness of 500 µm. A top surface 1205 of wafer 1202 is anisotropically etched using a nitride-oxide mask with a solution such as KOH to form a ball pit 1204. Ball pit 1204 has a perimeter that will align the center of ball lens 1602 (FIG. 18) to the emission point of the laser die.

In FIG. 15, oxide layer 110 is formed over bottom surface 105 and cavity 104 of wafer 102. An oxide layer 1206 is formed over top surface 1205 and ball pit 1204. In one embodiment, oxide layer 1206 is silicon dioxide grown thermally in steam and has a thickness up to approximately 2,500 Å. Wafers 102 and 1202 are then joined by fusion bonding.

In FIG. 16, cavity 112 is formed through wafer 102. Cavity 112 is defined by at least sidewalls 114 and 118. Sidewall 114 consists of portions 106 and 116.

In FIG. 17, an oxide layer 1520 is formed on sidewalls 114 and 118, and over the exposed portion of top surface 1205. In one embodiment, oxide layer 1520 is silicon dioxide grown thermally in steam and has a thickness at least 2,500 Å. Pad 124, pad 125, trace 126, trace 127, and bonding ring 128 are formed as described above. The resulting structure is a sub-mount 1500.

In FIG. 18, photodiode die 506 is mounted by AuSn solder on pad 125 and connected by bond wire 508 to trace 127. Laser die 502 is mounted by AuSn solder on pad 124 and connected by bond wire 504 to trace 126. Collimating ball lens 1602 is lastly mounted by epoxy in ball pit 1204. Laser die 502 is placed as close as possible to ball lens 1602 to accommodate the large divergent angles of laser die 502.

Figure 19:
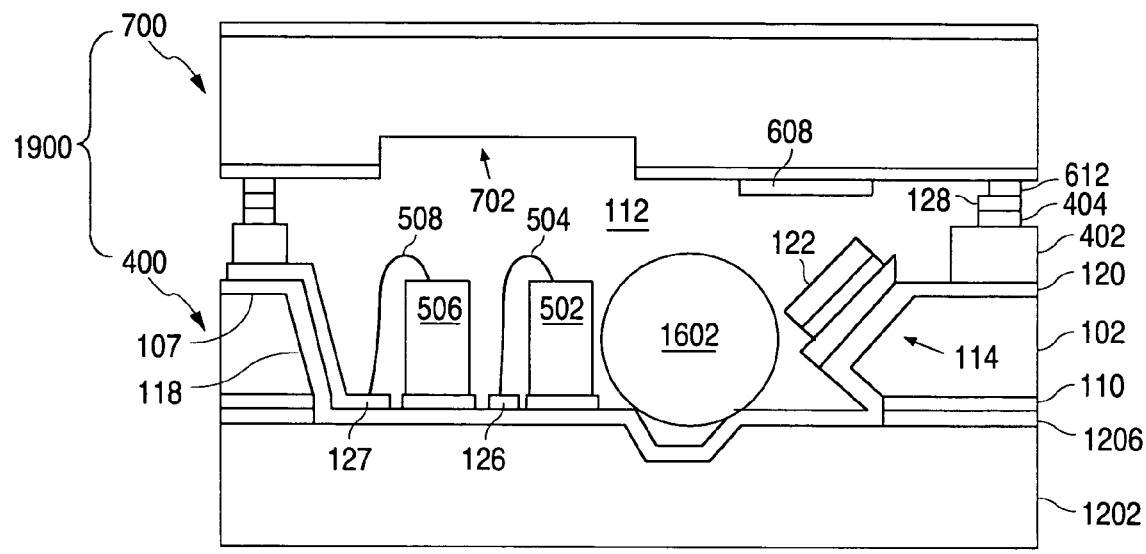

In FIG. 19, lid 700 is solder bonded on sub-mount 1500 to form optical package 1900. In operation, light diverges from the emission point of laser die 502 and enters ball lens 1602. Collimated light exits ball lens 1602 and is then reflected orthogonally by mirror 122 to lens 608. Lens 608 converges the light into an optical fiber (not shown). As the light is collimated after exiting ball lens 1602, the tolerance of the distance between ball lens 1602 and mirror 122 in package 1900 may be more relaxed than the distance between laser die 502 and mirror 122 in packages 800 (FIG. 10) and 1100 (FIG. 13) described above.

Figure 20:
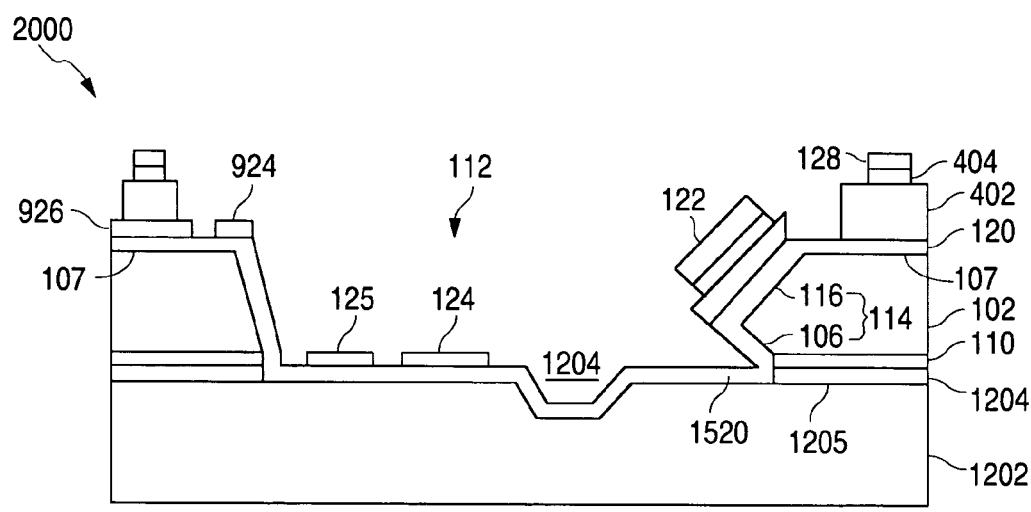
FIGS. 20 to 22 illustrate a method to make a non-hermetic optical package in another embodiment of the invention.
Figure 21:
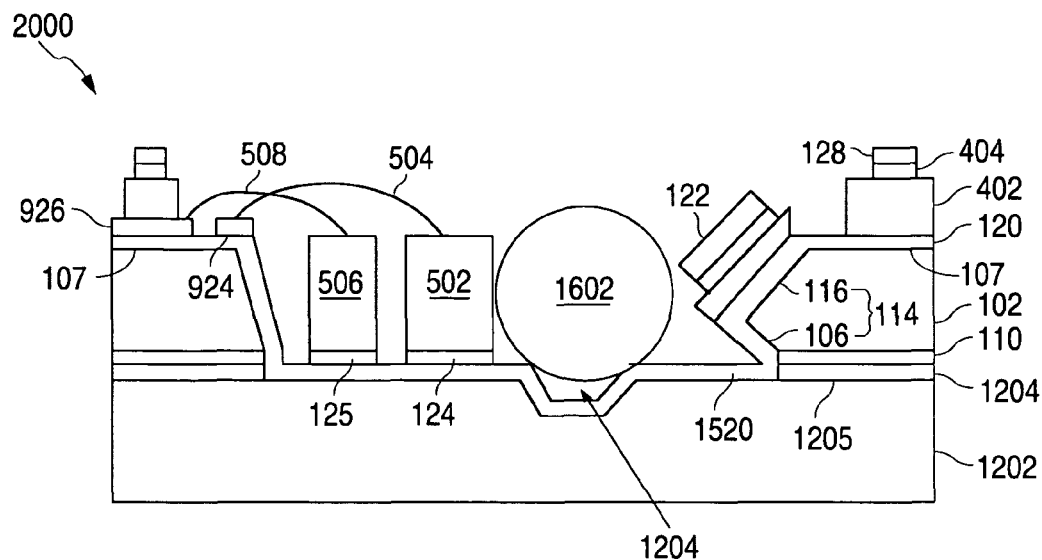
Figure 22:
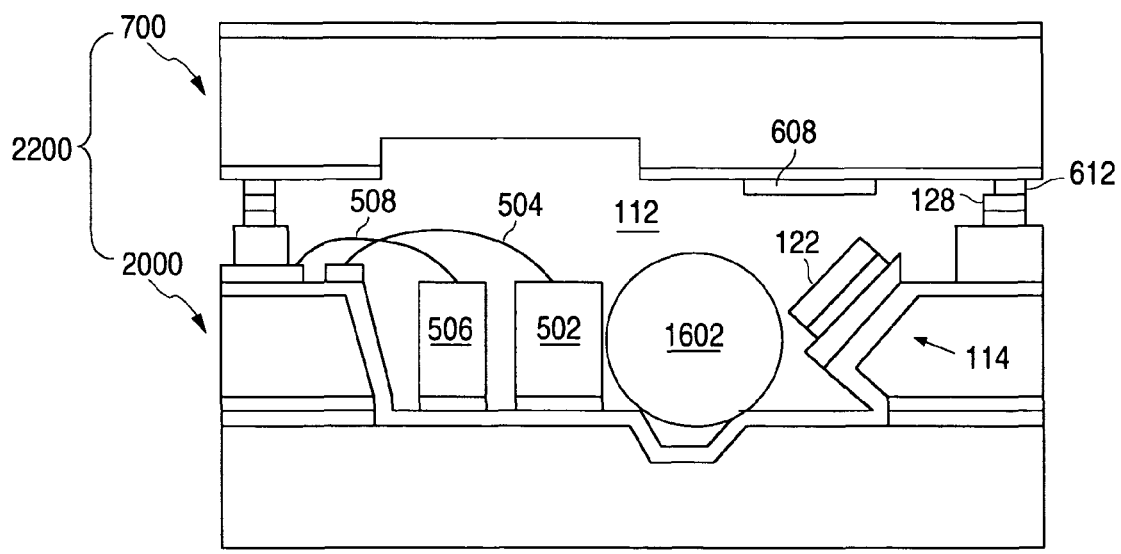

FIGS. 20 to 22 illustrate a method to make a hermetic optical package 2200 (FIG. 22) in one embodiment of the invention. Package 2200 is similar to package 1900 except that traces with critical dimensions are now located on top surface 107 of wafer 102. As described above, this improves signal speed and feature definitions.

In FIG. 20, a sub-mount 2000 is formed. Sub-mount 2000 is similar to sub-mount 1500 (FIG. 15) except that traces 924 and 926 have replaced traces 126 and 127. Traces 924 and 926 are formed on top surface 107 with methods described above for traces 126 and 127.

In FIG. 21, photodiode die 506 is mounted by AuSn solder on pad 125 and connected by bond wire 508 to trace 926. Laser die 502 is then mounted by AuSn solder on pad 124 and connected by bond wire 504 to trace 924. Collimating ball lens 1602 is lastly mounted by epoxy in ball pit 1204.

In FIG. 22, lid 700 is solder bonded to sub-mount 2000 to form optical package 2200.

FIGS. 23 to 31J illustrate a method to make a non-hermetic optical package 3100 (FIG. 31) in one embodiment of the invention.

Figure 23:
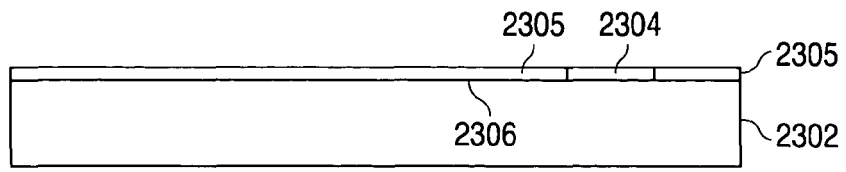
FIGS. 23 to 31J illustrate a method to make a non-hermetic optical package in another embodiment of the invention.

In FIG. 23, a wafer 2302 is provided. In one embodiment, wafer 2302 is a silicon wafer and has a thickness of 500 μm. A converging lens 2304 is formed on a top surface 2306 of wafer 2302. In one embodiment, lens 2304 is a DOE patterned from a stack of phase shifting layers. Adjacent phase shifting layers are separated by an etch stop layer used to successively etch the stack to form the desired diffractive lens. Converging lens 2304 is surrounded by oxide 2305 that is planar with lens 2304.

Figure 24:
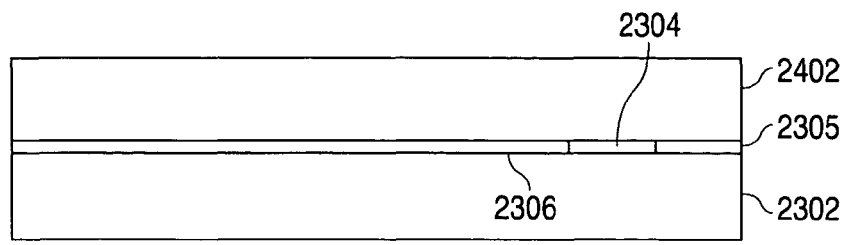

In FIG. 24, a transparent upper lid wafer 2402 is provided. In one embodiment, wafer 2402 is a Pyrex wafer and has a thickness of 500 μm. Wafers 2302 and 2402 are joined by bonding the top surface of lens 2304 to the bottom surface of wafer 2402. In one embodiment, wafers 2302 and 2402 are joined by anodic bonding.

Figure 25:
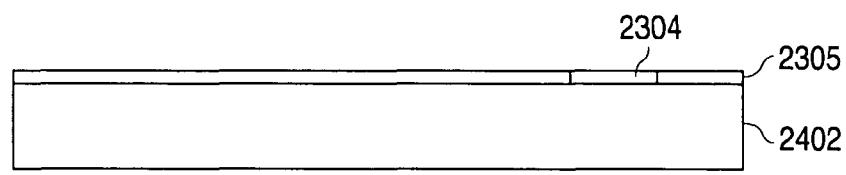

In FIG. 25, wafer 2302 (FIG. 24) is removed by grounding followed by wet etching. In FIG. 25, the orientation of the remaining wafer 2402 has been flipped so lens 2304 appears on top of wafer 2402. At this point, wafer 2402 and lens 2304 are collectively referred to as lens wafer 2402.

Figure 26:
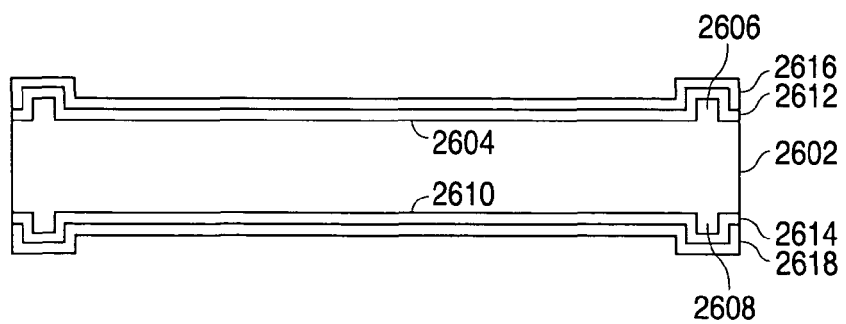

In FIG. 26, a lower lid wafer 2602 is provided. In one embodiment, wafer 2602 is an off-axis cut silicon wafer with a <100> plane oriented at a 9.7 degree offset from a top surface 2604 of wafer 2602 and has a thickness of approximately 500 μm. An upper ring 2606 is formed on top surface 2604 and a lower ring 2608 is formed on a bottom surface 2610 of wafer 2602. In one embodiment, rings 2606 and 2608 are formed by dry or wet etching (e.g., plasma etching) wafer 2602 and have a height of 2 μm.

An oxide layer 2612 is formed over top surface 2604 and an oxide layer 2614 is formed over bottom surface 2610. In one embodiment, oxide layers 2612 and 2614 are silicon dioxide grown thermally in steam and have a thickness of at least 2,500 Å. A nitride layer 2616 is formed over oxide layer 2612 and a nitride layer 2618 is formed over oxide layer 2614. In one embodiment, nitride layers 2616 and 2618 are silicon nitride formed by LPCVD.

Using photoresist, nitride layer 2616 is dry etched (e.g., plasma etched) to expose an area of oxide layer 2612. Using nitride layer 2616 as an etch mask, oxide layer 2612 is wet etched with an HF solution to expose an area on top surface 2604. Nitride layer 2616 and oxide layer 2612 form a nitride-oxide mask for wafer 2602.

Figure 27:
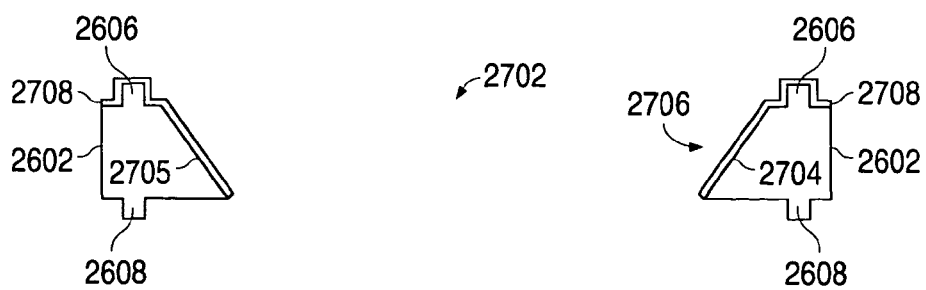

In FIG. 27, top surface 2604 (FIG. 26) of wafer 2602 is anisotropically etched using the nitride-oxide mask with a solution such as KOH to form a hole 2702 through wafer 2602. Hole 2702 is defined by at least an angled sidewall 2704 oriented at a 135 degree offset from top surface 2604 (FIG. 26), and an angled sidewall 2705 oriented at a 115.6 degree offset from top surface 2604.

Sidewall 2704 preferably has a smooth surface because it will be used to form a 45 degree turning mirror. However, sidewall 2704 can be roughened during the removal of the nitride layers 2616 and 2618 in the nitride-oxide mask used to form cavity 2702. Thus, an oxide layer can be thermally grown over upper portion sidewall 2704 after etching cavity 2702. Nitride layers 2616 and 2618 (FIG. 26) are removed by a dry etch (e.g., a plasma etch) and then the oxide layer over sidewall 2704 and oxide layers 2612 and 2614 are removed by a wet etch (e.g., an HF wet etch).

A 45 degree turning mirror 2706 is formed on sidewall 2704 by forming a metallization 2708 over wafer 2602. In one embodiment, metallization 2708 is titanium-platinum-gold (TiPtAu) metallization formed by evaporation.

Figure 28:
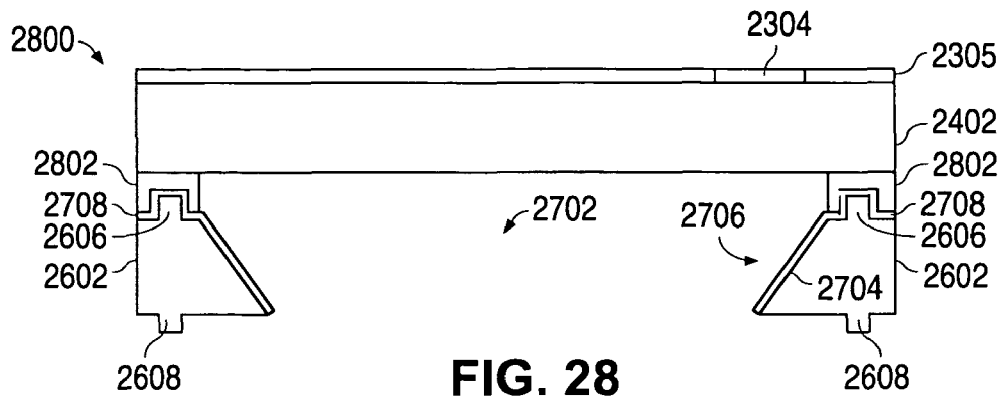

In FIG. 28, lens wafer 2402 is joined to wafer 2602. In one embodiment, wafers 2402 and 2602 are joined by epoxy 2802. Note that ring 2606 allows excessive epoxy to spread without overflowing to other areas. The resulting structure is a lid 2800.

Hereafter, two cross-sectional views of wafer 2902 (FIG. 29) are used to show the formation of various components on wafer 2902. FIGS. 29 to 31A illustrate cross-sectional views of wafer 2902 along line AA'. Note that lines AA' and BB' are not necessary orthogonal as shown in FIG. 30.

Figure 29:
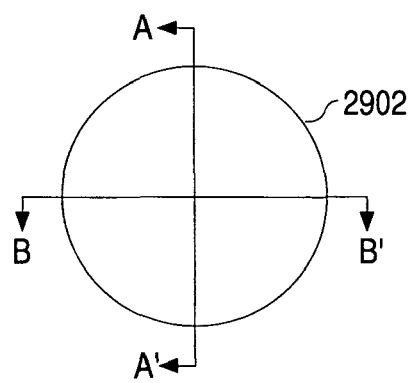
Figure 29:
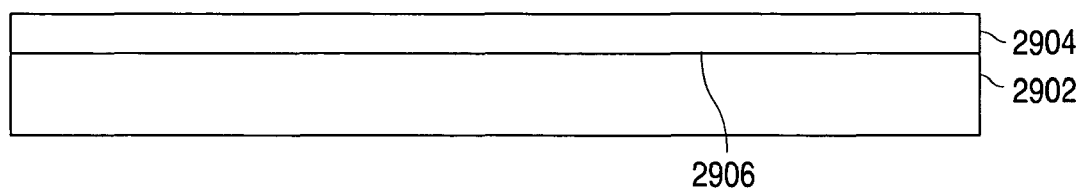
Figure 30:
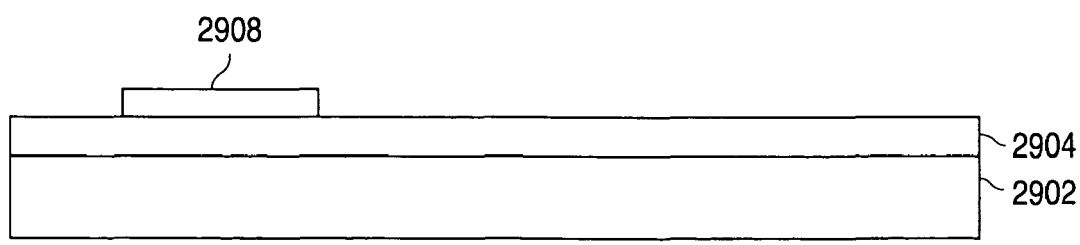

In FIG. 29, a sub-mount wafer 2902 is provided. In one embodiment, wafer 2902 is a silicon wafer and has a thickness of 500 μm. An oxide layer 2904 is formed on a top surface 2906 of wafer 2902. In one embodiment, oxide layer 2904 is silicon dioxide grown thermally in steam and has a thickness of up to approximately 1 μm.

In FIG. 30, a tantalum-nitride (TaN) metallization is formed on oxide layer 2904 and then patterned to form an impedance matching resistor 2908 (e.g., an RF matching resistor). In one embodiment, the TaN metallization is formed by sputtering and patterned by dry or wet etching (e.g., a plasma etching).

Figure 31A:
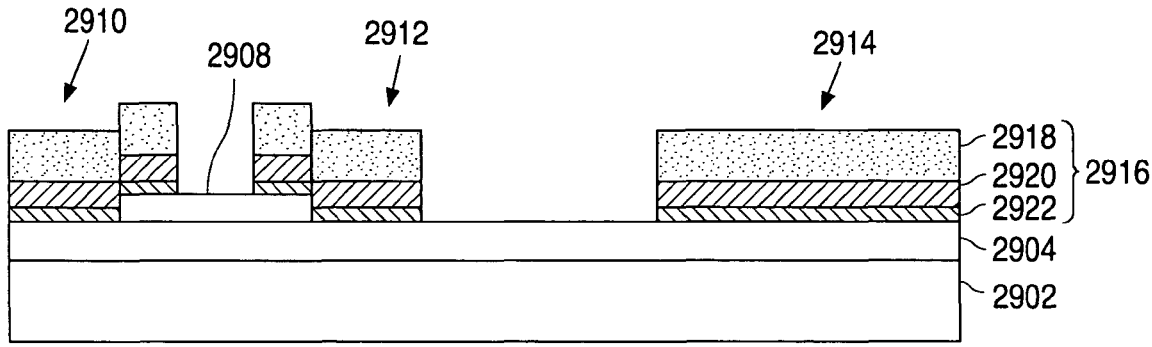

In FIG. 31A, traces 2910, 2912, and 2914 are formed. Traces 2910 and 2912 are connected to resistor 2908. Trace 2914 will be used to form a temperature measuring resistor 2915 (FIG. 31C).

Figure 31B:
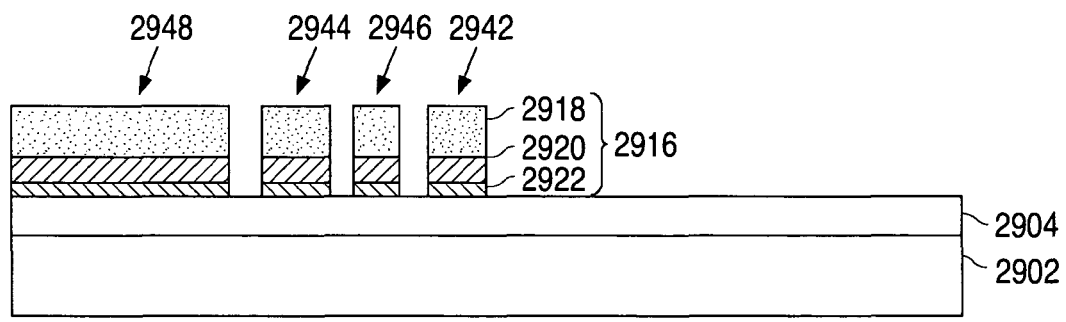
Figure 31C:
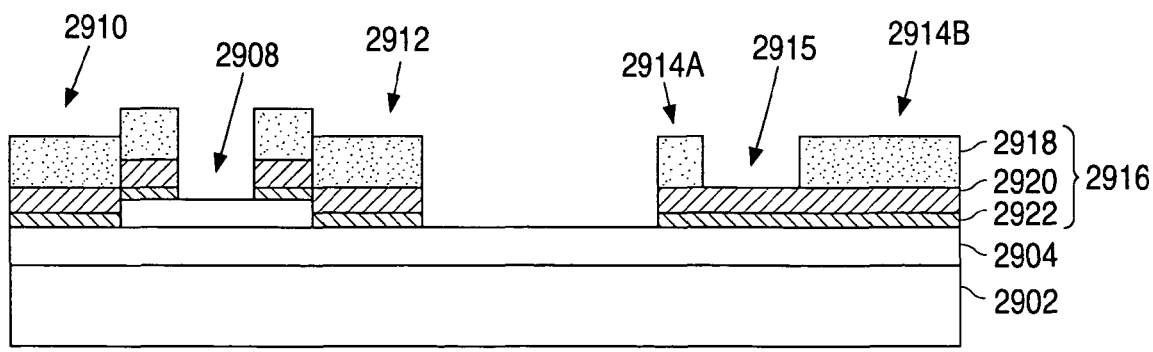

FIG. 31B illustrates a cross-sectional view of wafer 2902 along line BB'.

In FIG. 31B, pad 2942, pad 2944, trace 2946, and 2948 are formed. Traces 2946 and 2948 provide external electrical connections. Although not shown, pads 2942 and 2944 are connected to traces similar to traces 2946 and 2948 for external electrical connections.

In one embodiment, a TiPtAu metallization 2916 is lifted off to form the traces and pads shown in FIGS. 31A and 31B. Metallization 2916 consists of an Au conductor layer 2918, a Pt barrier layer 2920, and a Ti adhesion layer 2922.

FIGS. 31C to 31H illustrate cross-sectional views of wafer 2902 along line AA'.

In FIG. 31C, temperature measuring resistor 2915 is formed. In one embodiment, Au layer 2918 of trace 2914 (FIG. 31A) is patterned to form a TiPt temperature measuring resistor 2915. In one embodiment, the Au is patterned by wet etching. The remaining TiPtAu metallization 2916 becomes traces 2914A and 2914B connected to resistor 2915.

Figure 31D:
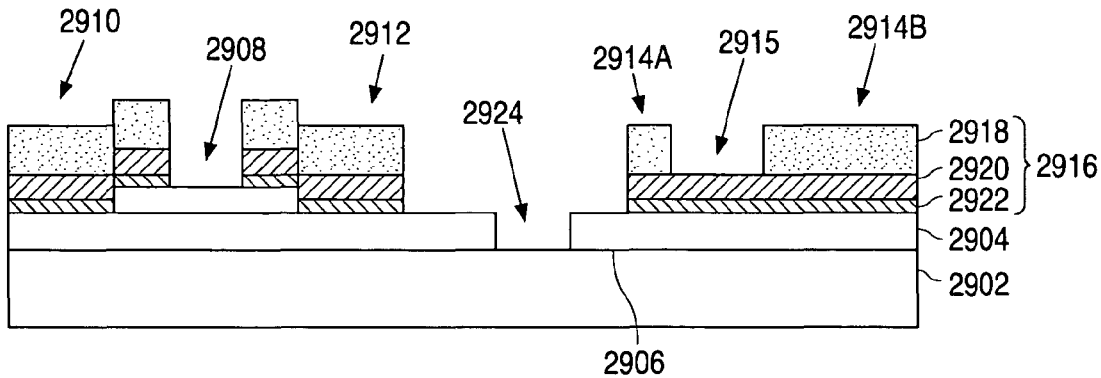

In FIG. 31D, oxide layer 2904 is patterned to form a window 2924 that exposes an area on top surface 2906 of wafer 2902. In one embodiment, oxide layer 2904 is patterned by an HF wet etch.

Figure 31E:
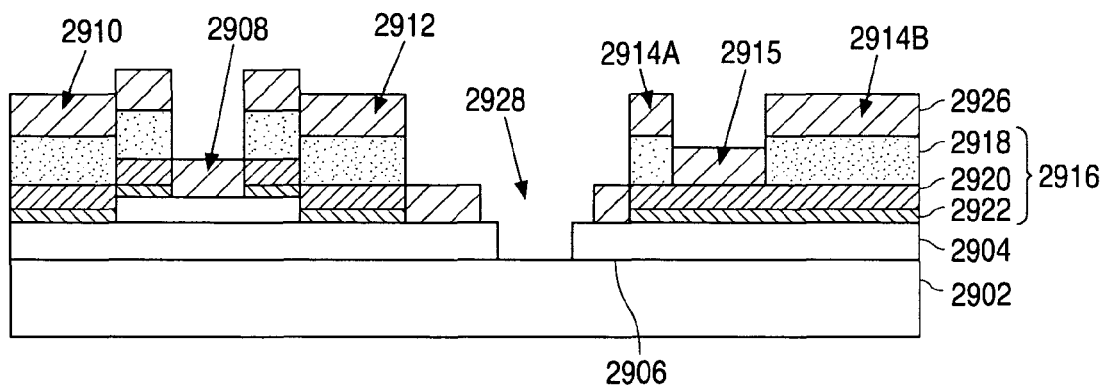

In FIG. 31E, a chromium-gold (CrAu) metallization 2926 is formed over the structure. CrAu metallization 2924 is patterned to form a window 2928 that exposes an area on top surface 2906. Note that CrAu metallization 2926 needs to be conformal in order to protect Ti layer 2922 and Au layer 2918 during the etching of 2902 wafer to form a ball bit. In one embodiment, NiCr metallization 2926 is formed by sputtering and patterned by wet etching.

Figure 31F:
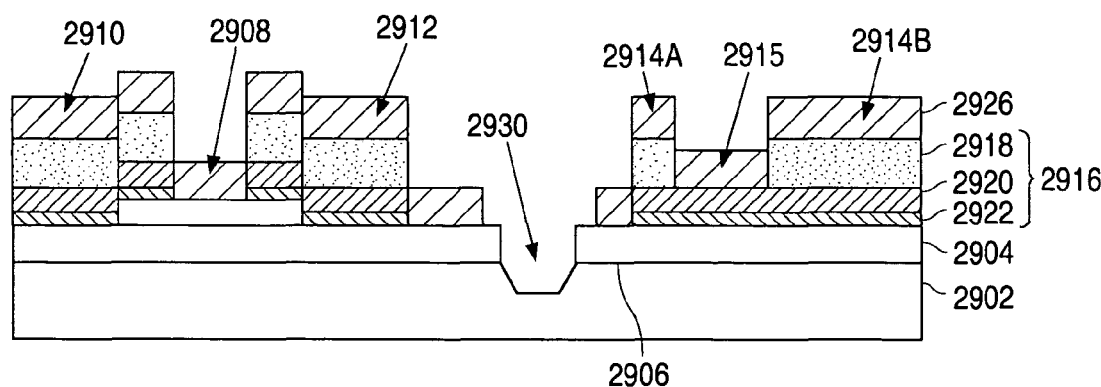

In FIG. 31F, top surface 2906 of wafer 2902 is anisotropically etched using a solution such as KOH to form a ball pit 2930.

Figure 31G:
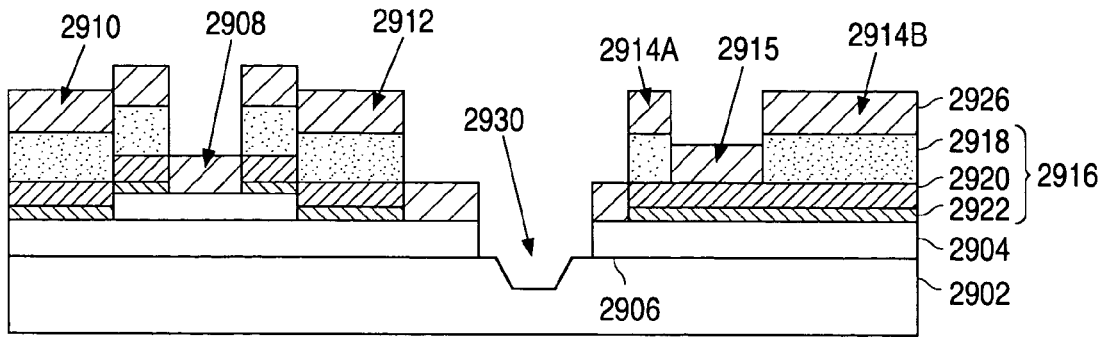

In FIG. 31G, oxide layer 2904 around ball pit 2930 is removed to clean up any overhang over ball pit 2930. In one embodiment, oxide layer 2904 is removed by an HF wet etch.

Figure 31H:
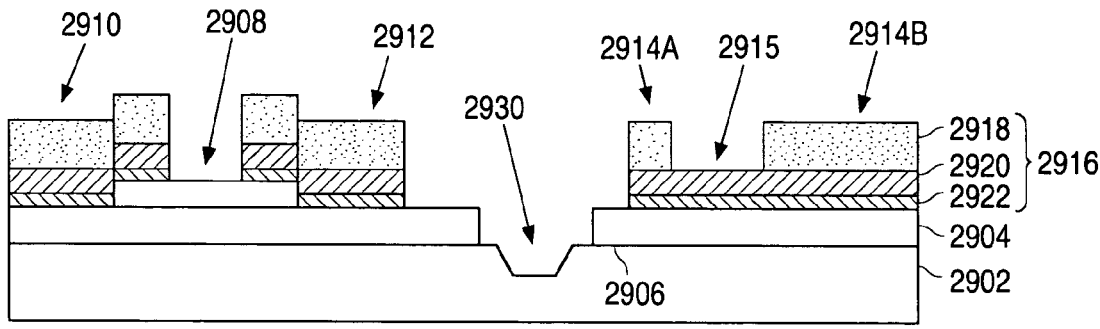

In FIG. 31H, CrAu metallization 2926 (FIG. 31G) is removed. In one embodiment, CrAu metallization 2926 is removed by wet ecthing successively by a gold etchant and then a Cr etchant.

Figure 31I:
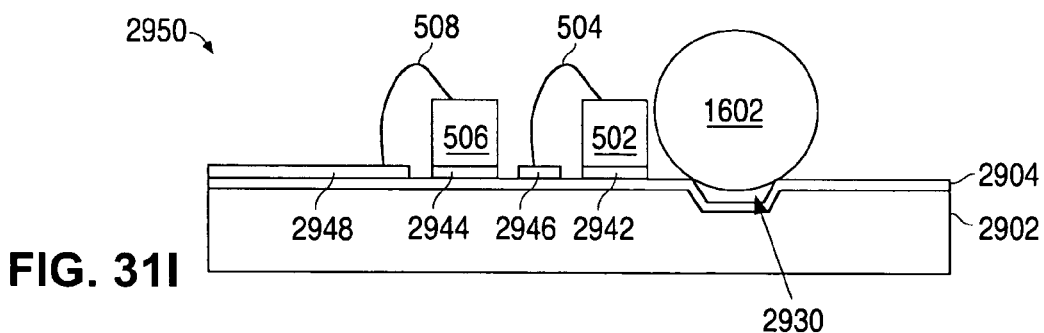
Figure 31J:
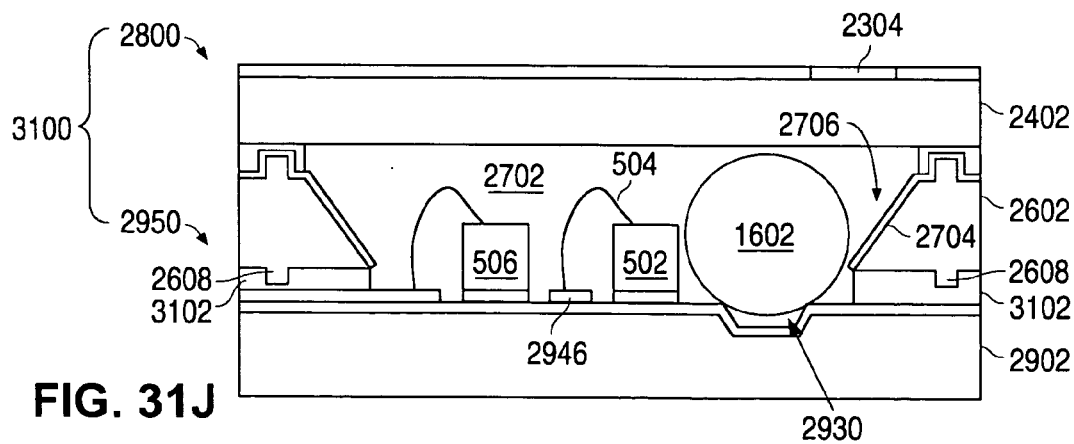

FIGS. 31I and 31J illustrate cross-sectional views of wafer 2902 along line BB'.

In FIG. 31I, photodiode die 506 is mounted by AuSn solder on pad 2944 and connected by bond wire 508 to trace 2948. Laser die 502 is then mounted by AuSn solder on pad 2942 and connected by bond wire 504 to trace 2946. Collimating ball lens 1602 is finally mounted by epoxy in ball pit 2930. The resulting structure is a sub-mount 2950.

In FIG. 31J, lid 2800 is bonded to sub-mount 2950 to form optical package 3100. In one embodiment, lid 2800 and sub-mount 2900 are bonded by epoxy 3102. Note that ring 2608 allows excessive epoxy to spread without overflowing to other areas of package 3100.

In operation, light diverges from the emission point of laser die 502 and enters ball lens 1602. Collimated light exits ball lens 1602 and is then reflected orthogonally by mirror 2706 to lens 2304. Lens 2304 converges the light into an optical fiber (not shown).

FIGS. 32 to 36N illustrate a method to make a hermetic optical package 3600 (FIG. 36C) in one embodiment of the invention.

Figure 32:
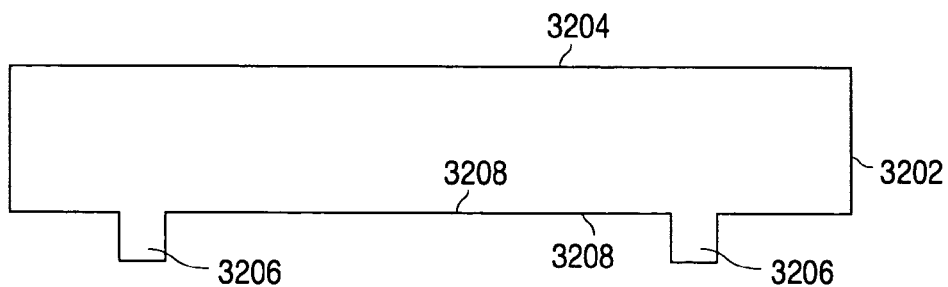
FIGS. 32 to 36N illustrate a method to make a hermetic optical package in another embodiment of the invention.

In FIG. 32, a wafer 3202 is provided. In one embodiment, wafer 3202 is an off-axis cut silicon wafer with a <100> plane oriented at a 9.7 degree offset from a top surface 3204 of wafer 3202 and has a thickness of approximately 500 μm. A ring 3206 is formed on a bottom surface 3208 of wafer 3202. In one embodiment, ring 3206 is formed by dry or wet etching (e.g., plasma etching) wafer 3202 and has a height of 2 μm.

Figure 33:
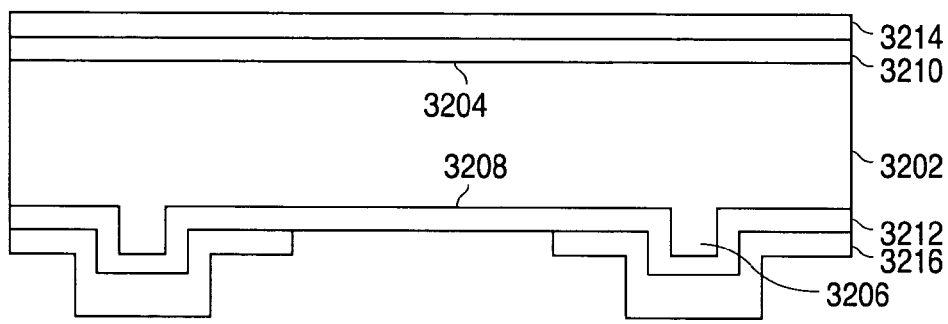

In FIG. 33, an oxide layer 3210 is formed over top surface 3204 and an oxide layer 3212 is formed over bottom surface 3208. In one embodiment, oxide layers 3210 and 3212 are silicon dioxide grown thermally in steam and have a thickness of up to approximately 2,500 Å. A nitride layer 3214 is formed over oxide layer 3210 and a nitride layer 3216 is formed over oxide layer 3212. In one embodiment, nitride layers 3214 and 3216 are silicon nitride formed by LPCVD and have a thickness of up to approximately 2,000 Å.

Figure 34:
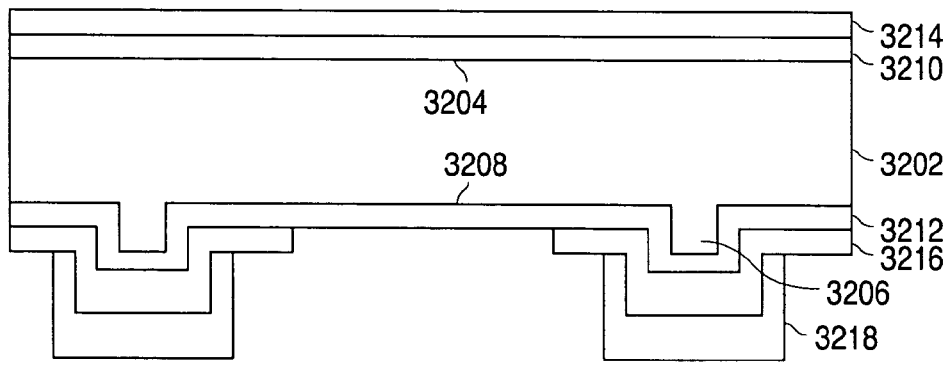

In FIG. 34, a seal ring 3218 is formed on ring 3206. In one embodiment, seal ring 3218 is TiPtAu metallization lifted off on ring 3206.

Figure 35A:
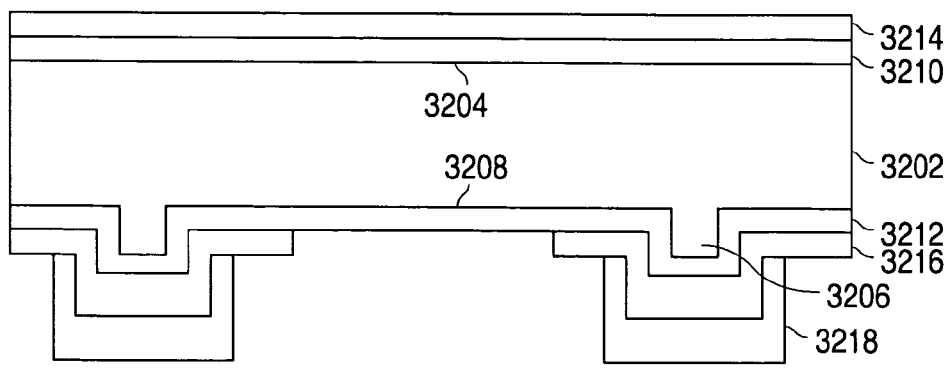

In FIG. 35A, nitride layer 3216 is patterned to expose an area on oxide layer 3208. In one embodiment, nitride layer 3214 is patterned by dry etching (e.g., plasma etching).

Figure 35B:
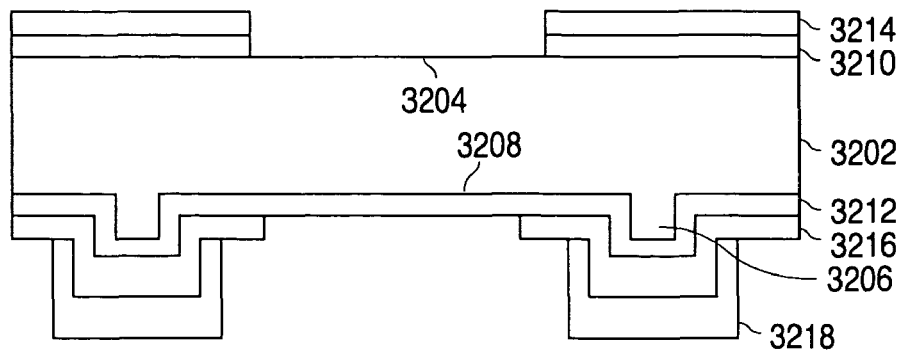

In FIG. 35B, nitride layer 3214 and oxide layer 3210 are patterned to expose an area on top surface 3204. In one embodiment, nitride layer 3214 is dry etched (e.g., plasma etched) to expose an area of oxide layer 3210 to be patterned, and oxide layer 3210 is wet etched with an HF solution to expose an area on top surface 3204 to be anisotropically etched.

Figure 35C:
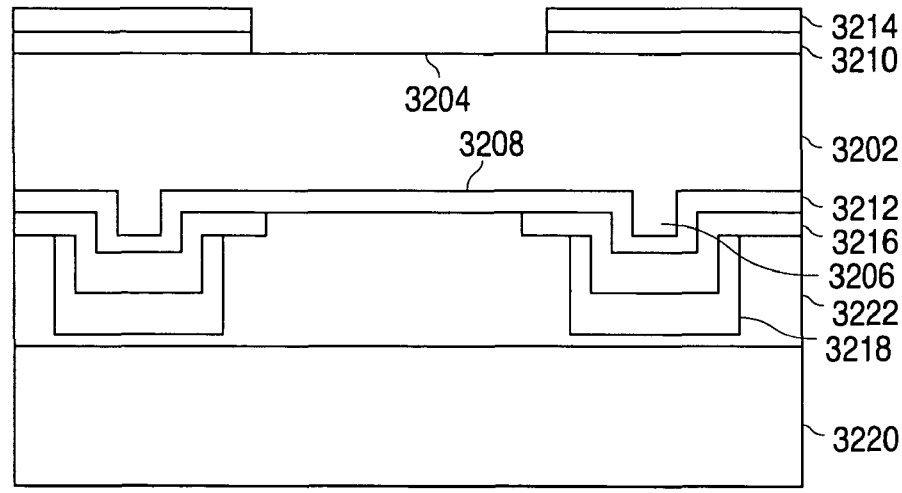

In FIG. 35C, wafer 3202 is mounted to a support wafer 3220 with wax 3222. In one embodiment, wax 3222 has a thickness of 0.003 inches and is precut to the shape of wafer 3202.

Figure 35D:
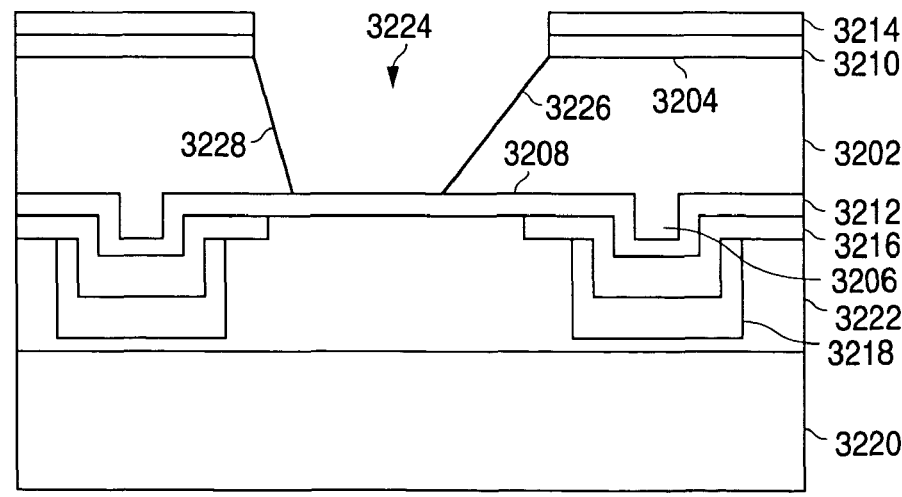

In FIG. 35D, wafer 3202 is dipped in a buffered HF solution to remove native oxide. Top surface 3204 is then anisotropically etched using a solution such as KOH to form a hole 3224 through wafer 3202 and down to oxide layer 3212. Hole 3224 is defined by at least an angled sidewall 3226 oriented at a 135 degree offset from top surface 3204, and an angled sidewall 3228 oriented at a 115.6 degree offset from top surface 3204.

Figure 35E:
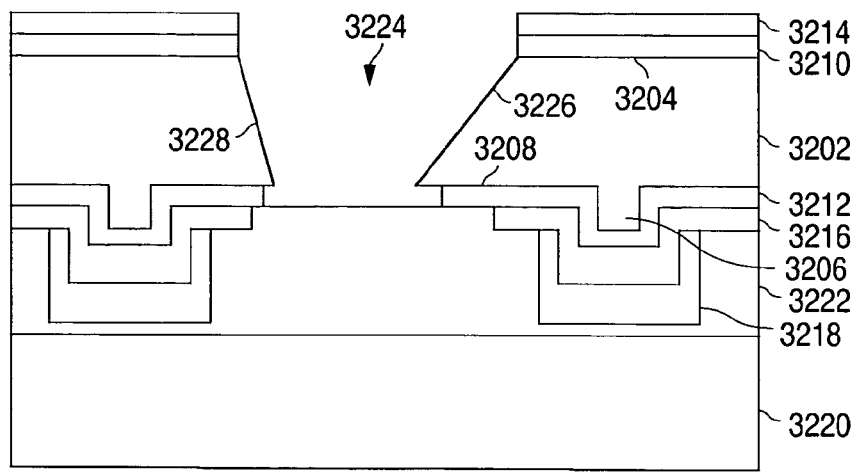

In FIG. 35E, oxide layer 3212 at hole 3224 is removed. In one embodiment, oxide layer 3212 is wet etched using a buffered HF solution.

Figure 35F:
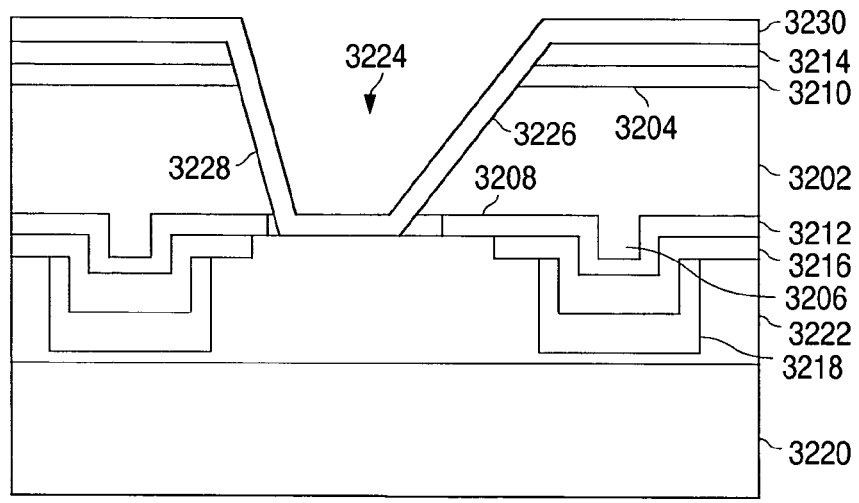

In FIG. 35F, a TiPtAu metallization 3230 is formed over the structure. For clarity, TiPtAu metallization is illustrated as a single layer. In one embodiment, TiPtAu metallization 3230 is formed by evaporation.

Figure 35G:
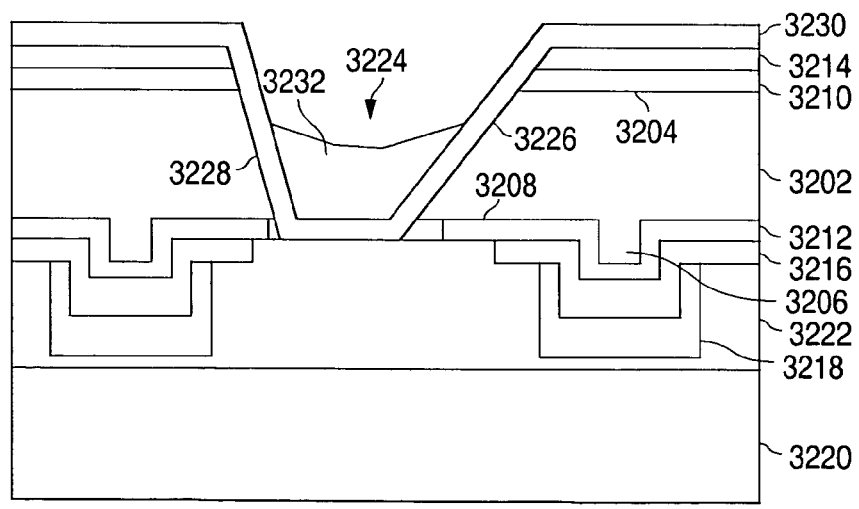

In FIG. 35G, a photoresist 3232 is spun on and collected in hole 3224. Photoresist 3232 is then exposed and developed. A dry etch (e.g., a plasma etch) is performed to clean up the top surface of TiPtAu metallization 3230 of any residual photoresist.

Figure 35H:
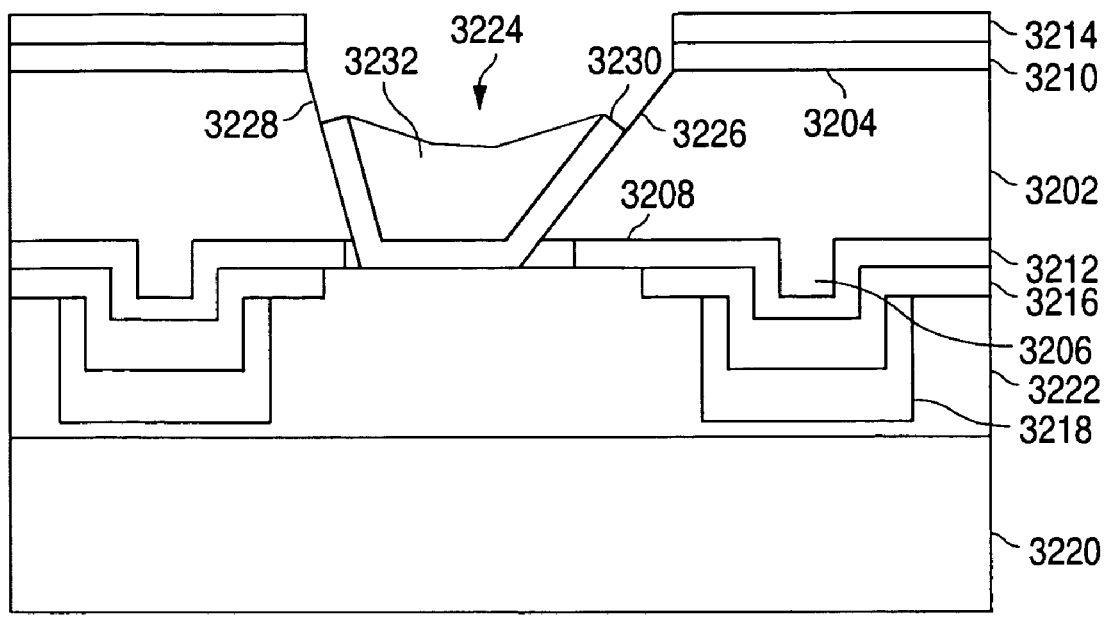

In FIG. 35H, portions of TiPtAu metallization 3230 not protected by photoresist 3232 are removed. In one embodiment, portions of TiPtAu metallization 3230 are removed by a wet etch using an aqua regia solution. The remaining TiPtAu metallization 3230 on angled sidewall 3226 forms a 45 degree turning mirror 3234. Note that instead of the steps shown in FIGS. 35F to 35H, a shadow mask may be used to form turning mirror 3234.

Figure 35I:
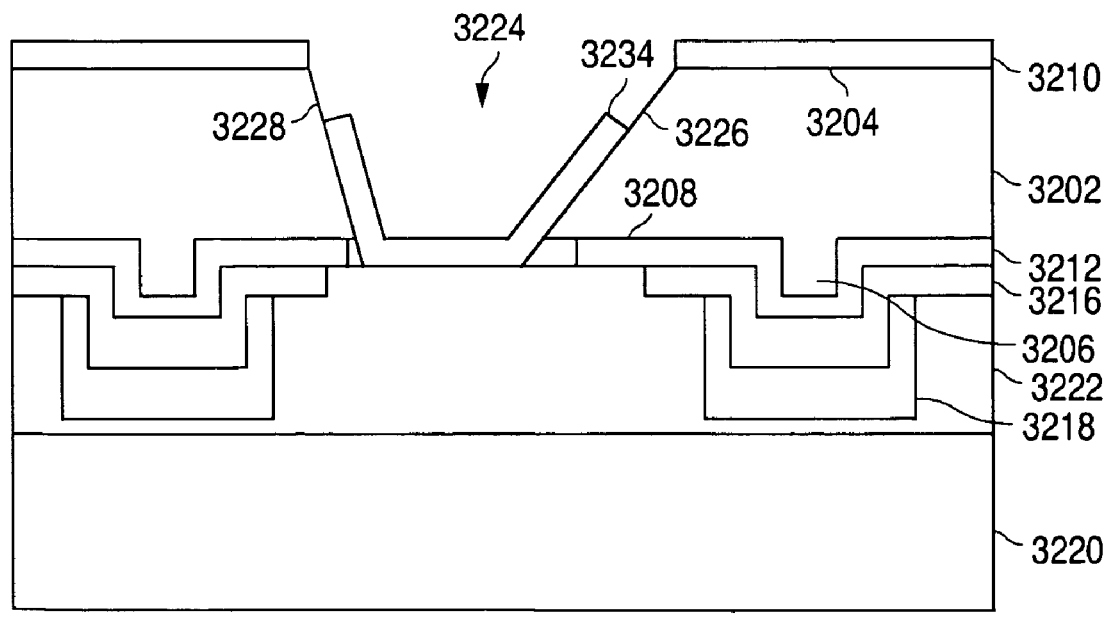

In FIG. 35I, nitride layer 3214 (FIG. 35H) is removed. In one embodiment, nitride layer 3214 is removed using a dry etch (e.g., a plasma etch). Photoresist 3232 is then stripped away.

Figure 35J:
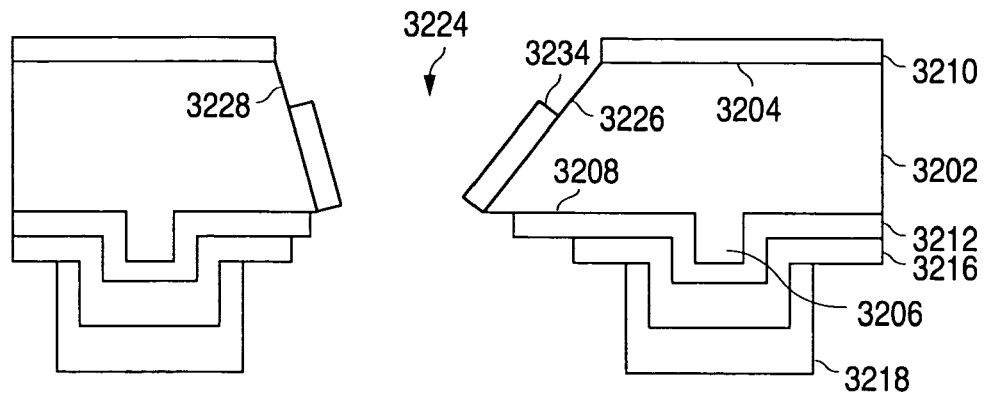

In FIG. 35J, wafer 3202 is demounted from support wafer 3220 (FIG. 35I). In one embodiment, any remaining wax 3222 (FIG. 35I) on wafer 3202 is removed with n-methyl pyrollidone (NMP).

Figure 35K:
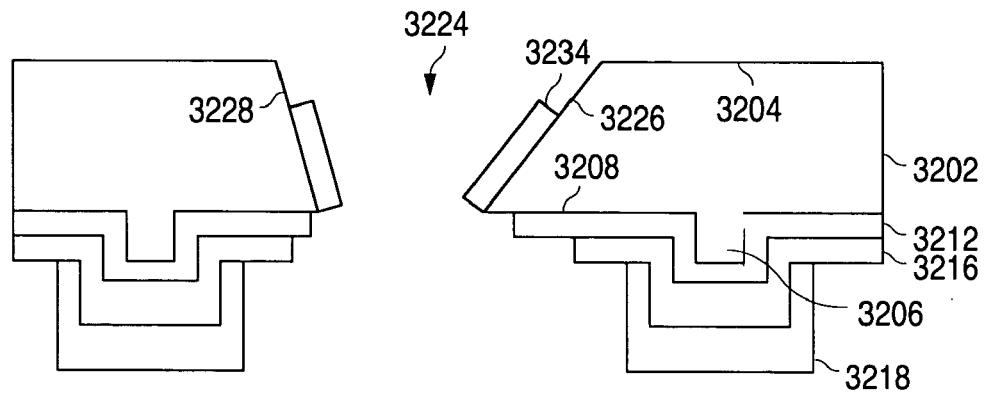

In FIG. 35K, oxide layer 3210 (FIG. 35J) and any oxide layer 3212 not protected by nitride layer 3216 are removed. In one embodiment, the oxide layers are removed using an HF wet etched.

Figure 35L:
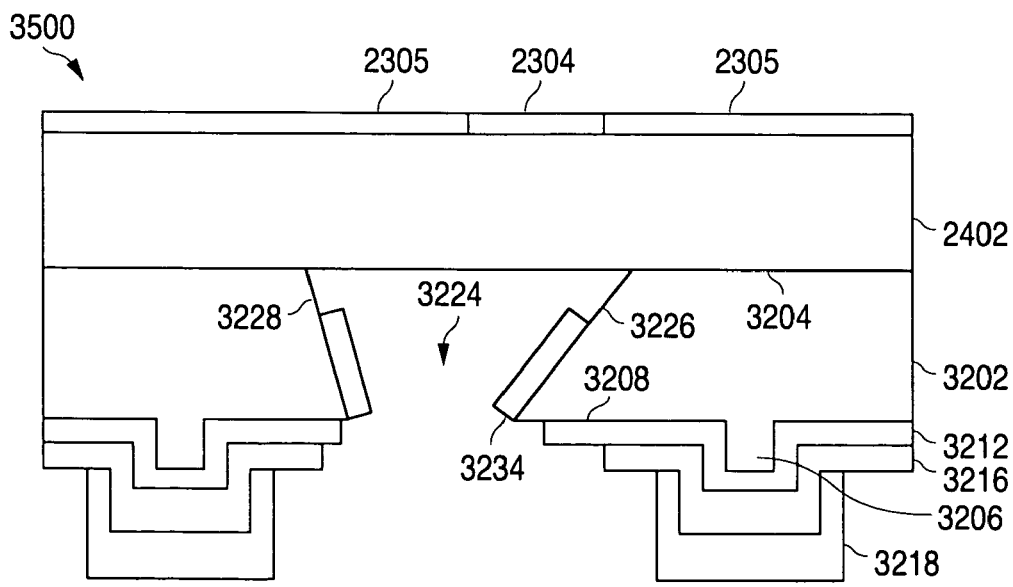

In FIG. 35L, transparent wafer 2402 with converging lens 2304 is provided. Wafer 2402 and converging lens 2304 are made as described above in relation to FIGS. 23 to 25. Transparent wafer 2402 is joined to wafer 3202. In one embodiment, wafers 2402 and 3202 are joined by anodic bonding. The resulting structure is a lid 3500.

Hereafter, two cross-sectional views of a wafer 3602 (FIG. 36A) are used to show the formation of various components on wafer 3602. FIGS. 36A to 36F illustrate cross-sectional views of wafer 2902 along line AA'.

Figure 36A:
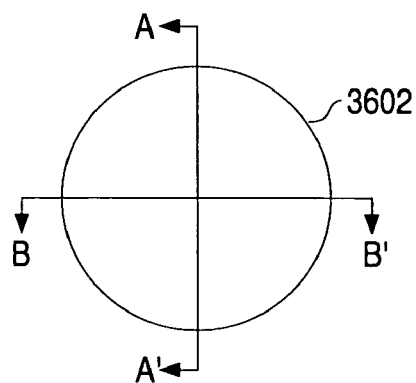
Figure 36A:
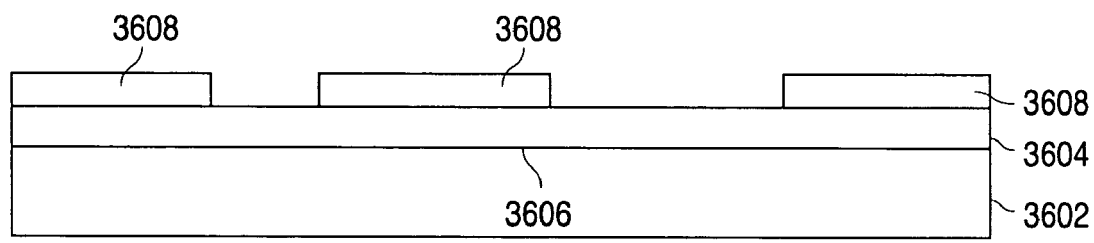

In FIG. 36A, wafer 3602 is provided. In one embodiment, wafer 3602 is a silicon wafer and has a thickness of 500 µm. An oxide layer 3604 is formed on a top surface 3606 of wafer 3602. In one embodiment, oxide layer 3604 is silicon dioxide grown thermally in steam and has a thickness of approximately 2,500 Å. Interconnects 3608 are formed on oxide layer 3604. In one embodiment, interconnects 3608 are titanium-gold-titanium (TiAuTi) metallization lifted off on oxide 3504 and has a thickness of approximately 0.5 µm.

Figure 36B:
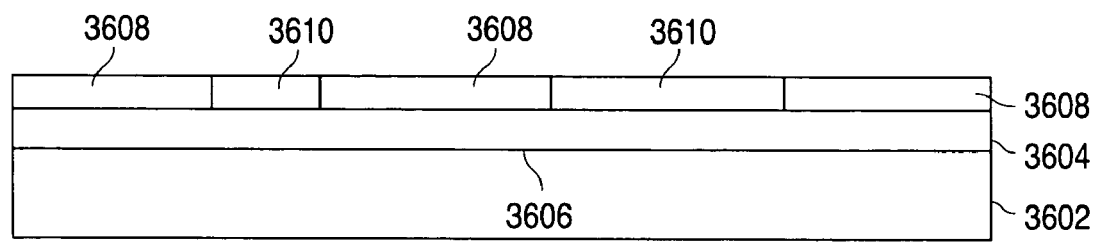

In FIG. 36B, an oxide layer 3610 is formed over the structure. In one embodiment oxide layer 3610 is silicon dioxide formed by PECVD and has a thickness of approximately 1.5 µm. Oxide layer 3610 is then planarized down to TiAuTi metallization 3608. In one embodiment, oxide layer 3610 is planarized by a chemical mechanical polishing (CMP) process down close to TiAuTi metallization 3608 to be level with TiAuTi metallization 3608.

Figure 36C:
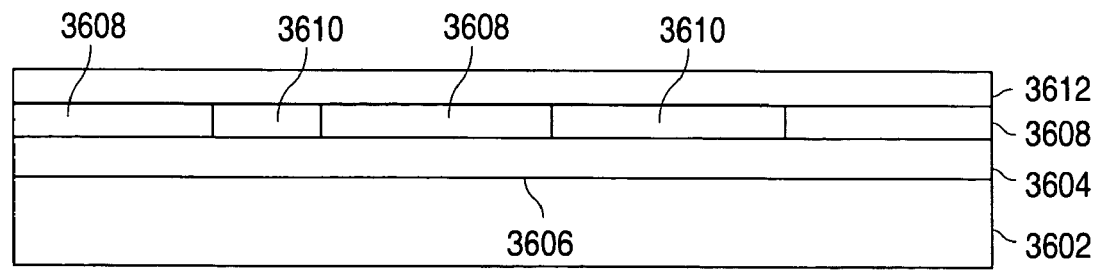

In FIG. 36C, an oxide layer 3612 is formed over the structure. In one embodiment, oxide layer 3612 is silicon dioxide formed by PECVD and has a thickness of 2 µm. After FIG. 36C, oxide layer 3610 is shown integral with oxide layer 3612.

Figure 36D:
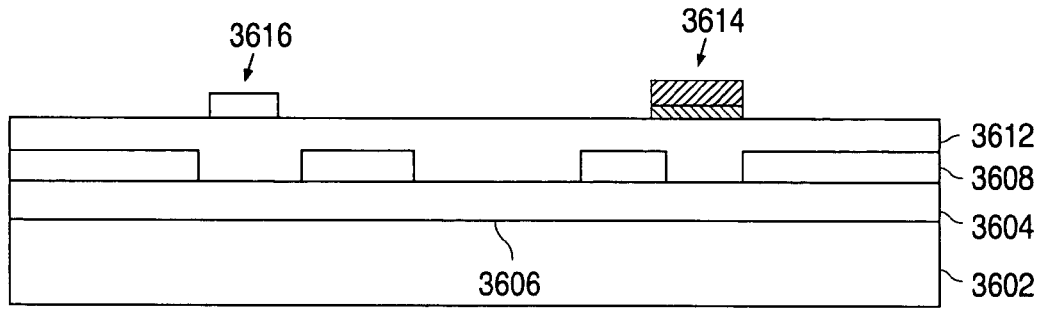

In FIG. 36D, a temperature measuring resistor 3614 and an RF matching resistor 3616 are formed. In one embodiment, a TiPt metallization is lifted off on oxide layer 3612 to form temperature measuring resistor 3614. In one embodiment, a TaN metallization (shown as a single layer) is deposited by reactive sputtering and patterned by dry etching (e.g., plasma etching) to form RF matching resistor 3616.

Figure 36E:
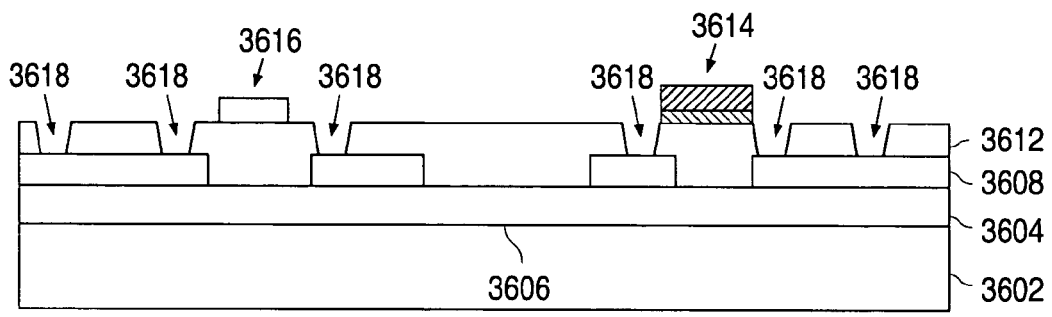

In FIG. 36E, vias 3618 to interconnects 3608 are formed through oxide layer 3612. In one embodiment, vias 3618 are formed by wet etching using a photoresist mask.

Figure 36F:
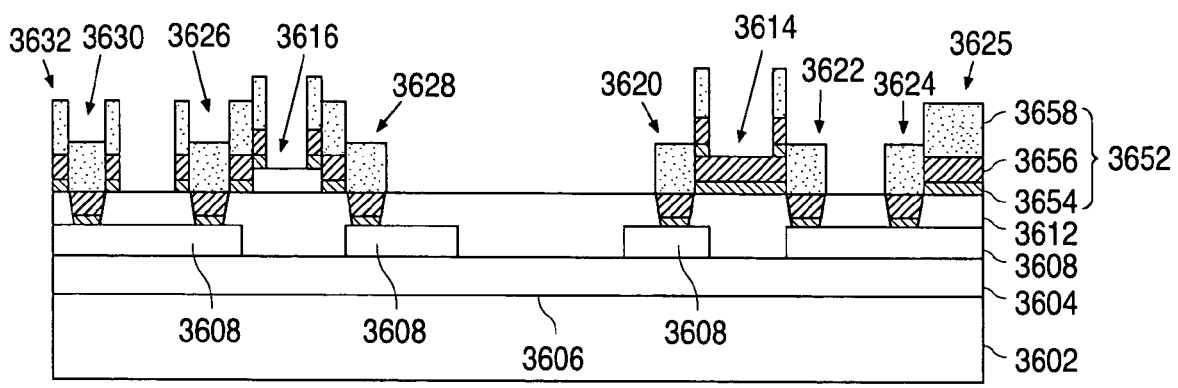

In FIG. 36F, plugs and traces are formed. Specifically, plugs 3620 and 3622 connect temperature measuring resistor 3614 to respective interconnects 3608, and plugs 3624 (only one is visible) connect the respective interconnects 3608 to traces 3625 (only one is visible) that will provide external electrical connections. Similarly, plugs 3626 and 3628 connect RF matching resistor 3616 to respective interconnects 3608, and plugs 3630 (only one is visible) connects the respective interconnects 3608 to traces 3632 (only one is visible) that will provide external electrical connections.

Figure 36G:
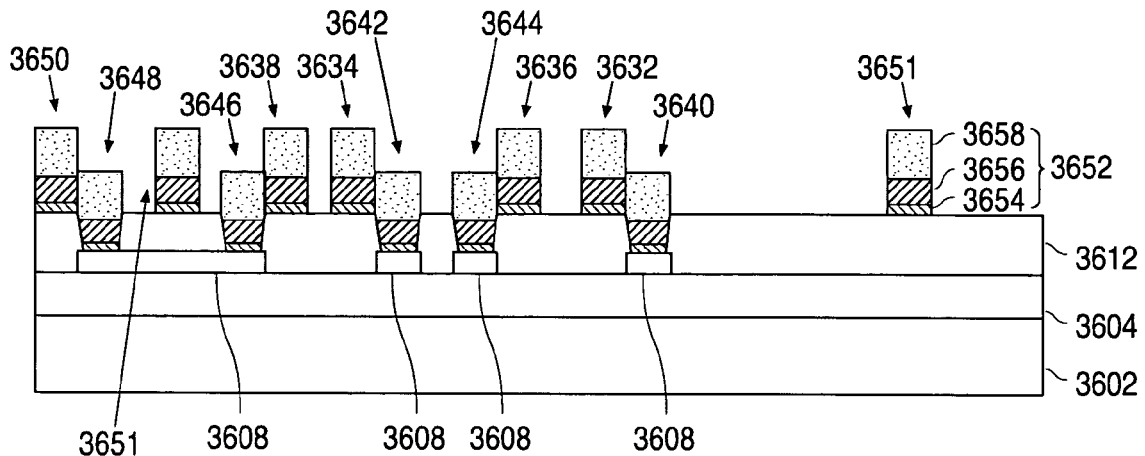

FIG. 36G illustrates a cross-sectional view of wafer 3602 along line BB'.

In FIG. 36G, plugs, pads, traces, and a sealing ring are formed. Specifically, pads 3632 and 3634 are formed to receive laser and photodiode dies, and pads 3636 and 3638 are formed to receive bond wires. Plugs 3640, 3642, 3644, and 3646 connect respective pads 3632, 3634, 3636, 3638 to respective interconnects 3608. Plugs 3648 (only one is visible) connect respective interconnect 3608 to traces 3650 (only one is visible) that provide external electrical connections. A sealing ring 3651 is formed around components to be enclosed within the finished package.

In one embodiment, a TiPtAu metallization 3652 is lifted off to form the plugs, pads, traces, and sealing ring shown in FIGS. 36F and 36G. Metallization 3652 consists of a Ti adhesion layer 3654, a Pt barrier layer 3656, and an Au conductor layer 3658.

FIGS. 36H to 36L illustrate cross-sectional views of wafer 2902 along line AA'.

Figure 36H:
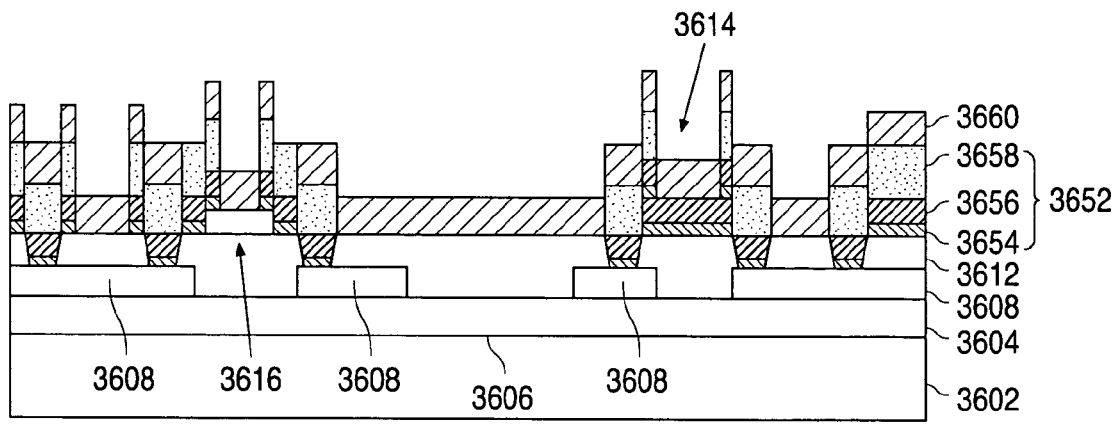

In FIG. 36H, a CrAu metallization 3660 is formed over the structure. Note that CrAu metallization 3660 needs to be conformal to protect the Ti and the Au layers in the TiPtAu metallization during the etching of wafer 3602 to form a ball pit. In one embodiment, NiCr metallization 3660 is formed by sputtering.

Figure 36I:
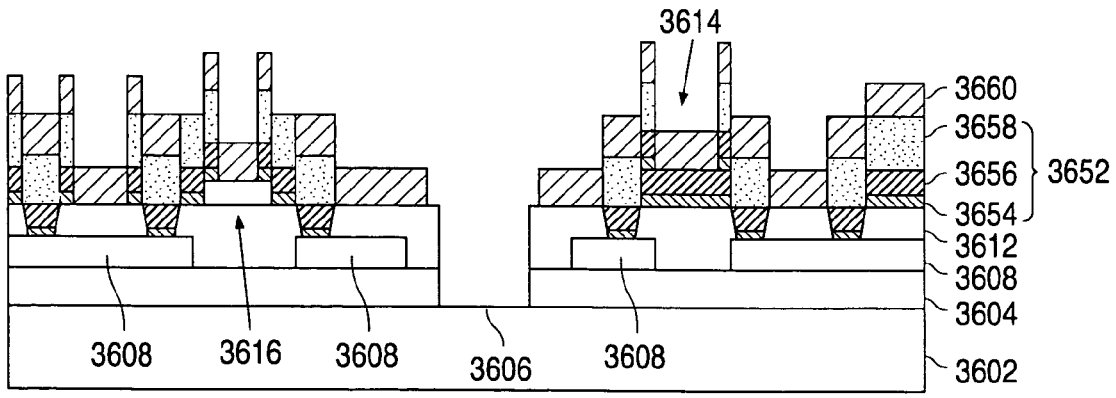

In FIG. 36I, CrAu metallization 3660 is patterned to expose an area of oxide layer 3612. In one embodiment, CrAu metallization is patterned by dry or wet etching (e.g., plasma etching). Oxide layers 3612 and 3604 are then patterned down to top surface 3606 of wafer 3602. In one embodiment, oxide layer 3612 is patterned by an HF wet etch.

Figure 36J:
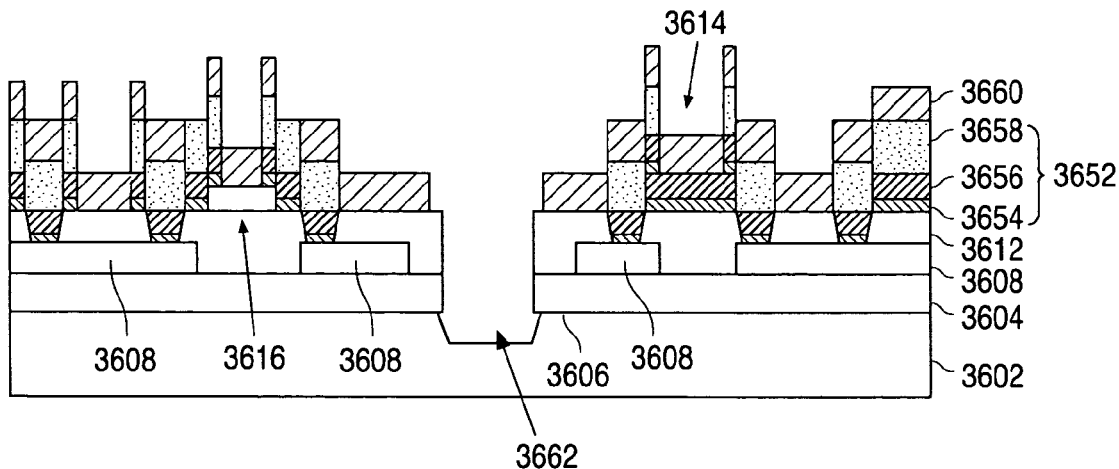

In FIG. 36J, top surface 3606 is anisotropically etched using a solution such as KOH to form a ball pit 3662.

Figure 36K:
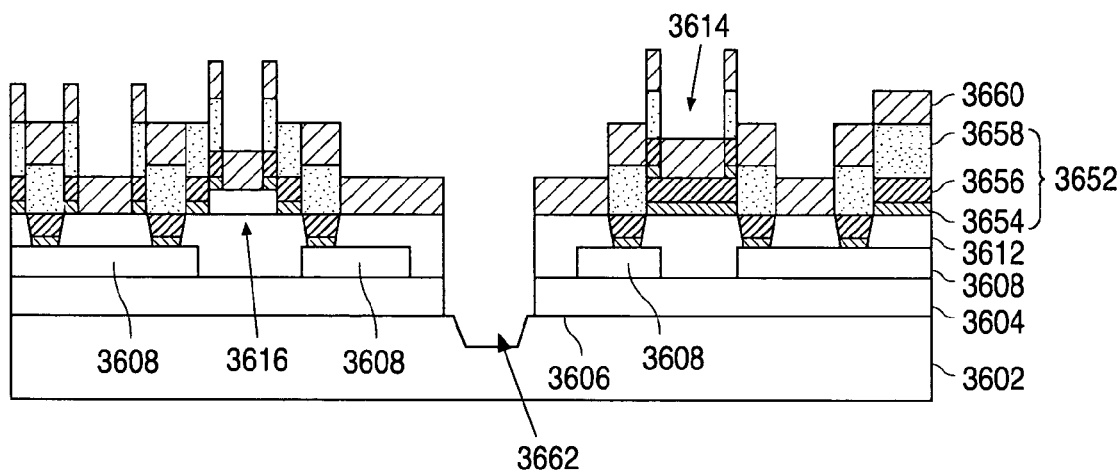

In FIG. 36K, oxide layers 3604 and 3612 around ball pit 3662 are etched to clean up any overhang over ball pit 3662.

Figure 36L:
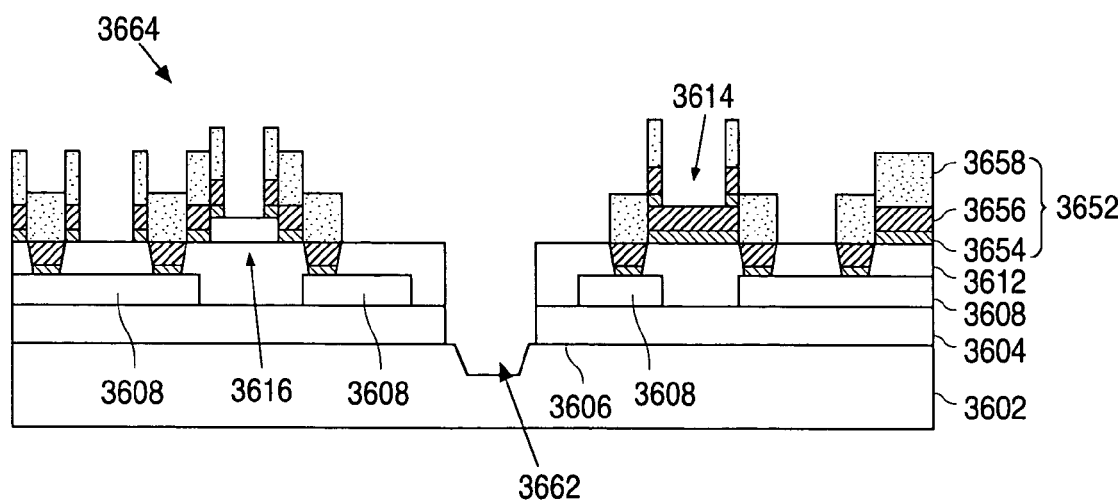

In FIG. 36L, CrAu metallization 3660 is removed. In one embodiment, CrAu metallization 3660 is removed by wet etching. The resulting structure is a sub-mount 3664.

Figure 36M:
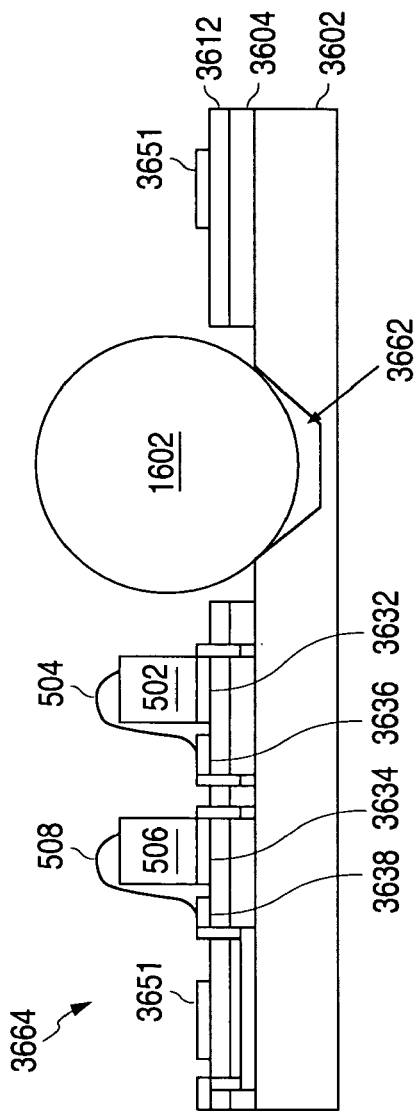
Figure 36N:
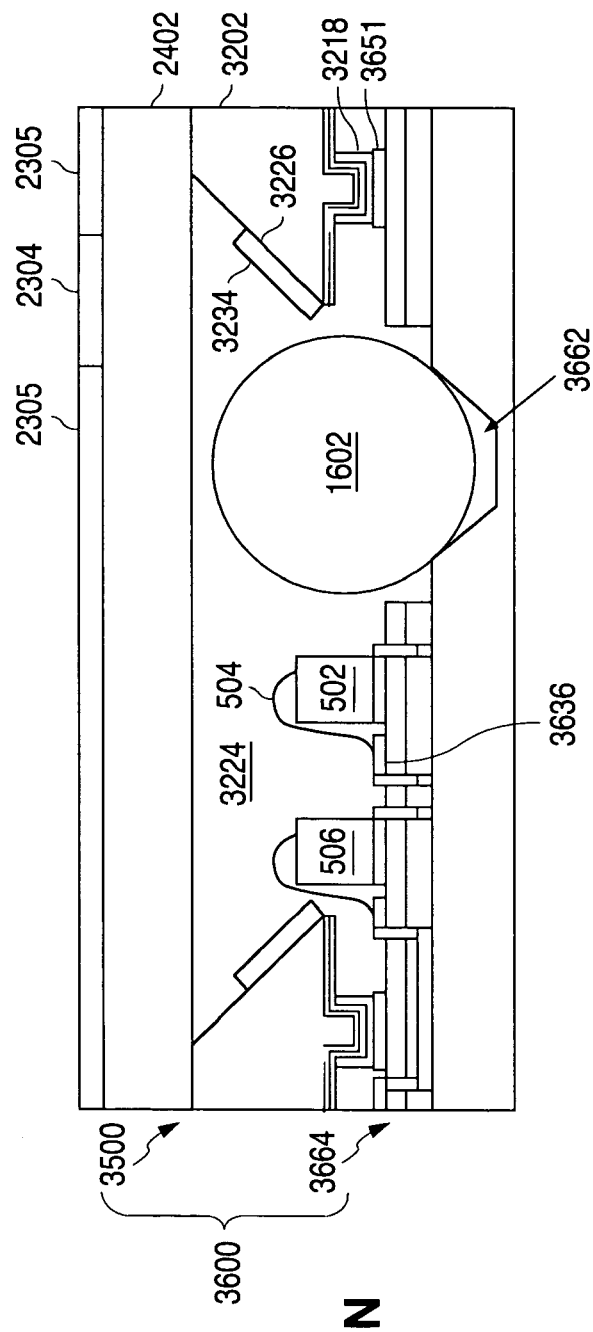

FIGS. 36M and 36N illustrate cross-sectional views of wafer 2902 along line BB'.

In FIG. 36M, photodiode die 506 is mounted by AuSn solder on pad 3634 and connected by bond wire 508 to wire bond pad 3638. Laser die 502 is then mounted by AuSn solder on pad 3632 and connected by bond wire 504 to pad 3636. Collimating ball lens 1602 is lastly mounted by epoxy in ball pit 3662. The resulting structure is a sub-mount 3664.

In FIG. 36N, lid 3500 is solder bonded to sub-mount 3664 to form optical package 3600. Moderate temperature is applied to form a solder bond between bonding rings 3218 and 3651. In operation, light diverges from the emission point of laser die 502 and enters ball lens 1602. Collimated light exits ball lens 1602 and is then reflected orthogonally by mirror 3234 to lens 2304. Lens 2304 converges the light into an optical fiber (not shown).

FIGS. 37 to 42 illustrate a method to form an optical package 4200 (FIG. 42) in one embodiment of the invention. Package 4200 is similar to packages 3100 and 3600 except that the lid now has vertical sidewalls and no turning mirror is built into the sidewall of the lid. Instead, a separate mirror is placed on the sub-mount. Using a lid with vertical sidewalls helps to reduce the overall size of the optical package. This is because angled sidewalls create a larger footprint than vertical sidewalls. Optical package 4200 can be made non-hermetic like package 3100 or hermetic like package 3600.

Figure 37:
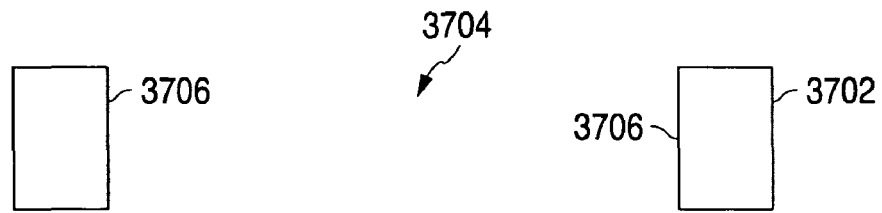
FIGS. 37 to 42 illustrate a method to form a non-hermetic optical package in another embodiment of the invention.

In FIG. 37, a wafer 3702 is provided. In one embodiment, wafer 3702 is a Pyrex wafer and has a thickness of 500 µm. A hole 3704 is formed through wafer 3702. Hole 3704 is defined by vertical sidewalls 3706. In one embodiment, hole 3704 is formed by ultrasonic machining.

Figure 38:
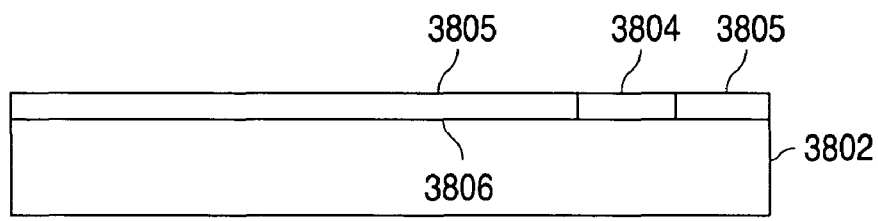

In FIG. 38, a wafer 3802 is provided. In one embodiment, wafer 3802 is a silicon wafer and has a thickness of 500 µm. A converging lens 3804 is formed on a top surface 3806 of wafer 3802. Converging lens 3804 is surrounded by oxide 3805 that is planar with lens 3804. In one embodiment, lens 3804 is a DOE patterned from a stack of phase shifting layers. Adjacent phase shifting layers are separated by an etch stop layer used to successively etch the stack to form the desired diffractive lens. Hereinafter wafer 3802 and lens 3804 are collectively referred to as lens wafer 3802.

Figure 39:
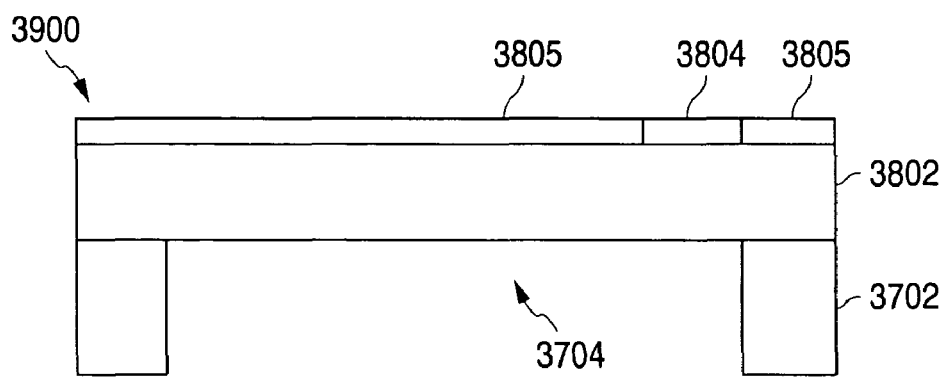

In FIG. 39, lens wafer 3802 is joined to wafer 3702 to form a lid 3900. In one embodiment, lens wafer 3802 and wafer 3702 are joined by anodic bonding.

Figure 40A:
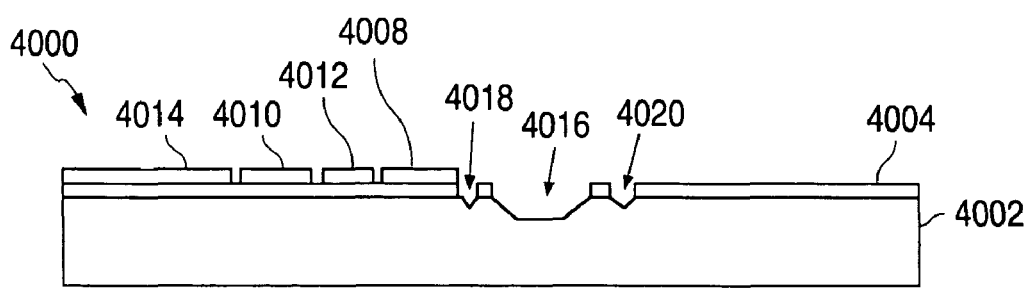

In FIG. 40A, a sub-mount wafer 4002 is provided. Wafer 4002 is a silicon wafer and has a thickness of 500 µm. An oxide layer 4004 is formed on a top surface 4006 of wafer 4002. In one embodiment, oxide layer 4004 is silicon dioxide grown thermally in steam and has a thickness of up to approximately 2,500 Å. Pad 4008, pad 4010, trace 4012, and trace 4014 are formed on oxide layer 4004. In one embodiment, the pads and the traces are titanium-gold (TiAu) metallization formed by evaporation and then patterned by wet etching. Top surface 4006 is anisotropically etched to form a ball pit 4016. In one embodiment, ball pit 4016 is formed by a KOH wet etch while the pads and the traces are protected by a chrome/gold etch mask during the wet etch.

Figure 40B:
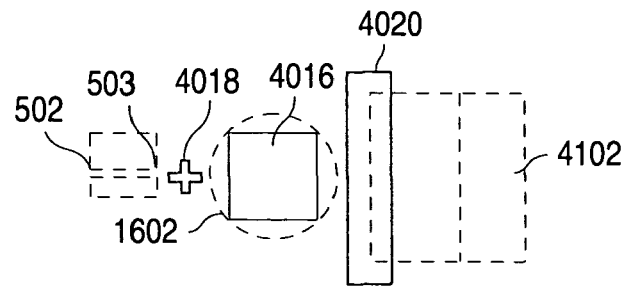

In FIG. 40B, fiduciary marks 4018 and 4020 are formed using the same etch mask as ball pit 4016. Fiduciary mark 4018 is used to align the laser die while fiduciary mark 4020 is used to align the turning mirror. In one embodiment, fiduciary mark 4018 is shaped like a cross while fiduciary mark 4020 is a shaped like a slot. The resulting structure is a sub-mount 4000.

Although not shown, additional components can be formed on wafer 4002. For example, an RF matching resistor and a temperature measuring resistor can be formed on wafer 4002. These resistors can be formed like their counterparts in packages 3100 (FIG. 31J) and 3600 (FIG. 36N). Furthermore, although the traces on sub-mount 4000 are shown to be on oxide layer 4002, they can also be connected by plugs to interconnects beneath oxide layer 4004, which can connect by plugs to traces that lead outside of the finished package. The traces, plugs, and interconnects can be formed like their counterparts in packages 3100 and 3600.

Figure 41:
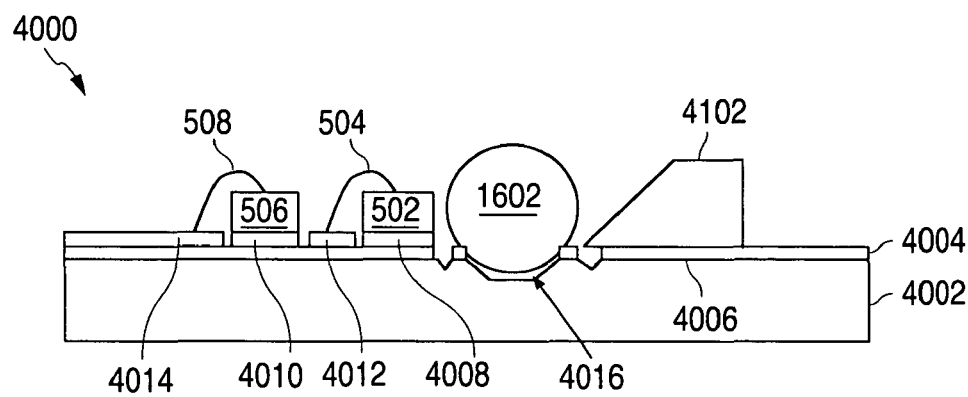
Figure 42:
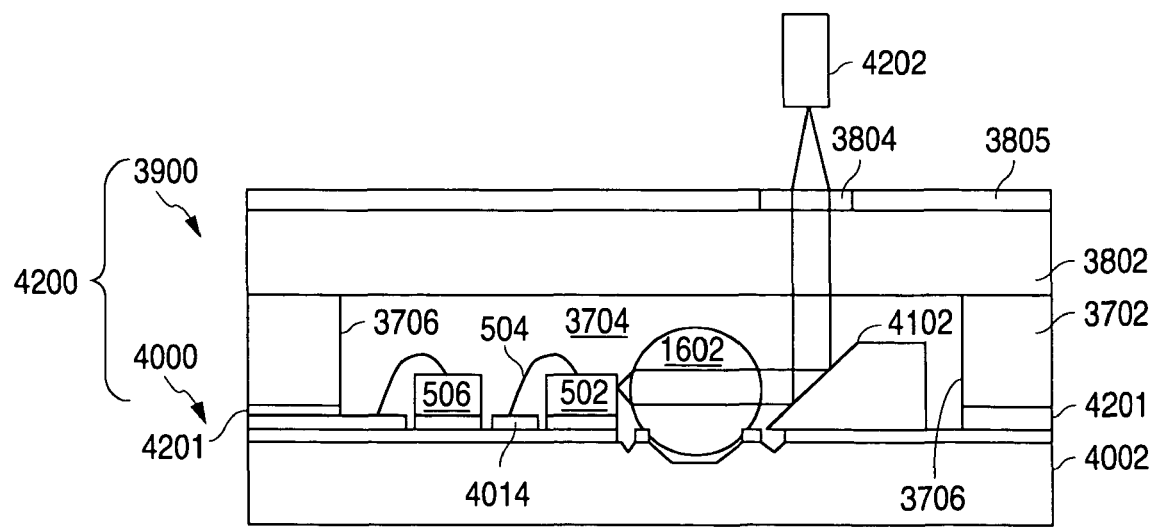

In FIG. 41, photodiode die 506 is mounted on pad 4010 and connected by bond wire 508 to trace 4014. Laser die 502 is mounted on pad 4008 so its emission point 503 aligns with fiduciary mark 4018 (FIG. 40B). Laser die 502 is connected by bond wire 504 to trace 4012. Collimating ball lens 1602 is lastly mounted in ball bit 4016. In one embodiment, ball lens 1602 is fixed by epoxy.

A discrete 45 degree turning mirror 4102 is mounted on top surface 4006 so its front edge aligns with fiduciary mark 4020 (FIG. 40B). In one embodiment, mirror 4102 is aligned when its front edge is within fiduciary mark 4020. In one embodiment, mirror 4102 is fixed by epoxy. In one embodiment, mirror 4102 is made in a wafer-scale process as follows. An off-axis cut wafer is wet etched to from multiple cavities with 135 degree sidewalls. The wafer is then coated with a reflective material on the 135 degree sidewalls. The wafer is finally singulated to form the individual mirrors In FIG. 42, lid 3900 is joined to sub-mount 4000 to form optical package 4200. In one embodiment, lids 3900 and sub-mount 4000 are joined by epoxy 4201. Alternatively, lid 3900 and sub-mount 400 can be joined by a solder bond similar to package 3600.

In operation, light diverges from the emission point of laser die 502 and enters ball lens 1602. Collimated light exits ball lens 1602 and is then reflected orthogonally by mirror 4102 to lens 3804. Lens 3804 converges the light into an optical fiber 4202.

Various other adaptations and combinations of features of the embodiments disclosed are within the scope of the invention. Numerous embodiments are encompassed by the following claims.

What is claimed is:

1. A package, comprising:
a sub-mount defining a cavity, the sub-mount comprising a bottom wafer and a middle wafer atop the bottom wafer, the middle wafer having crystal planes oriented at oblique angles from a surface of the middle wafer, the middle wafer having a first sidewall and a second sidewall formed therein, the first sidewall comprising a turning mirror, the bottom wafer defining a bottom cavity surface, the cavity extending between the first sidewall and the second sidewall, the second sidewall oriented along a first crystal plane, the first sidewall comprising a wedge-shape with a top angled portion and a bottom angled portion meeting at a wedge point above the bottom cavity surface, the top angled portion comprising the mirror and oriented along a second crystal plane, the bottom angled portion oriented along the first crystal plane parallel to the second sidewall;
an edge-emitting laser mounted on the bottom cavity surface adjacent to the first sidewall so the edge-emitting laser is opposite the minor; and
a lid comprising a top wafer, the lid mounted atop the sub-mount, wherein the turning mirror directs a light from the edge-emitting laser through the lid.

2. The package of claim 1, further comprising a collimating ball lens mounted on the bottom cavity surface between the edge-emitting laser and the turning mirror.

3. The package of claim 1, further comprising a detector mounted on the bottom cavity surface adjacent to the edge-emitting laser.

4. The package of claim 1, further comprising:
a trace comprising a first portion on the bottom cavity surface, a second portion up another sidewall of the cavity, and a third portion on a top surface of the sub-mount; and
a bond wire connecting the first portion of the trace and the edge-emitting laser.

5. The package of claim 4, wherein the lid defines an indentation above the edge-emitting laser that accommodates the bond wire.

6. The package of claim 1, further comprising:
a trace on a top surface of the sub-mount; and
a bond wire connecting the trace and the edge-emitting laser.

7. The package of claim 1, wherein the lid comprises a lens above the mirror, the lens being selected from the group consisting of a collimating lens and a converging lens.

* * * * *